United States Patent
Hamre et al.

(10) Patent No.: US 8,354,640 B2
(45) Date of Patent: Jan. 15, 2013

(54) OPTICALLY BASED PLANAR SCANNER

(75) Inventors: John D. Hamre, Plymouth, MN (US); Daniel F. Maase, Plymouth, MN (US)

(73) Assignee: Identix Incorporated, Bloomington, MN (US)

( * ) Notice: Subject to any disclaimer, the term of this patent is extended or adjusted under 35 U.S.C. 154(b) by 314 days.

(21) Appl. No.: 12/878,535

(22) Filed: Sep. 9, 2010

(65) Prior Publication Data
US 2011/0063604 A1    Mar. 17, 2011

Related U.S. Application Data

(60) Provisional application No. 61/241,546, filed on Sep. 11, 2009.

(51) Int. Cl.
*G02F 1/295* (2006.01)
*G01J 5/08* (2006.01)

(52) U.S. Cl. ............................ 250/338.1; 385/10

(58) Field of Classification Search ............... 250/216, 250/234, 330, 332, 334, 336.1, 338.1, 338.4; 359/245; 385/8, 10
See application file for complete search history.

(56) References Cited

U.S. PATENT DOCUMENTS

| | | |
|---|---|---|
| 2003/0038824 A1 | 2/2003 | Ryder |
| 2005/0254752 A1 | 11/2005 | Domash et al. |
| 2006/0119837 A1 | 6/2006 | Raguin et al. |
| 2008/0304123 A1 | 12/2008 | Wang et al. |

OTHER PUBLICATIONS

International Search Report and Written Opinion for PCT/US2010/048474 mailed Nov. 4, 2010.

*Primary Examiner* — Mark R Gaworecki
(74) *Attorney, Agent, or Firm* — Weaver Austin Villeneuve & Sampson LLP

(57) ABSTRACT

Apparatus and methods for providing an optically based planar scanner for generating an image are provided. In one embodiment, the apparatus includes a switchable Bragg grating. An area of the switchable Bragg grating is configured to be activated to direct light to a platen. The platen is configured to reflect the light to a waveguide or to refract the light. The light reflected to the waveguide is guided to a light detector. By activating a number of the areas of the switchable Bragg grating and measuring the intensity of the light with a light detector, an image of an object contacting the platen may be formed.

35 Claims, 16 Drawing Sheets

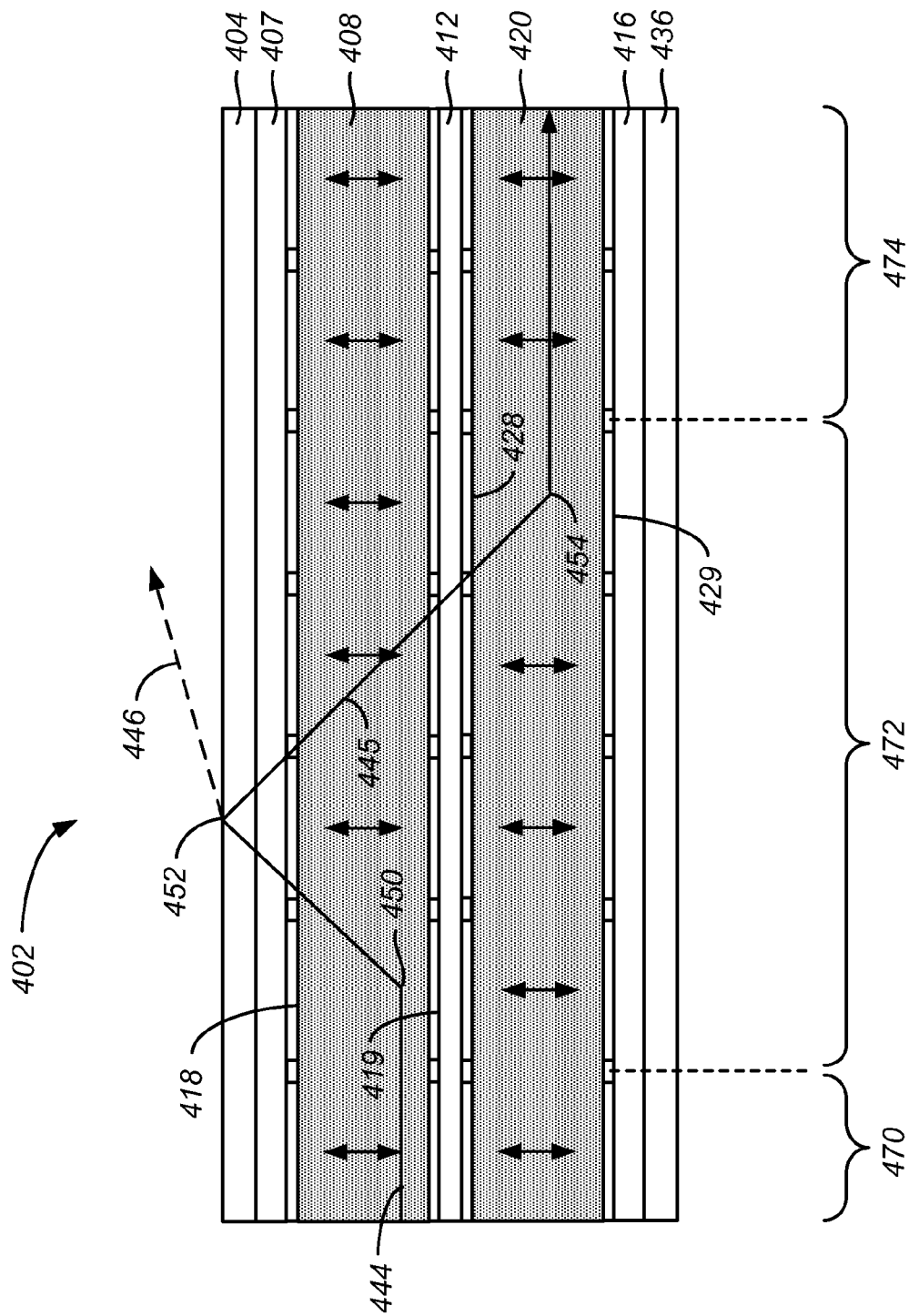

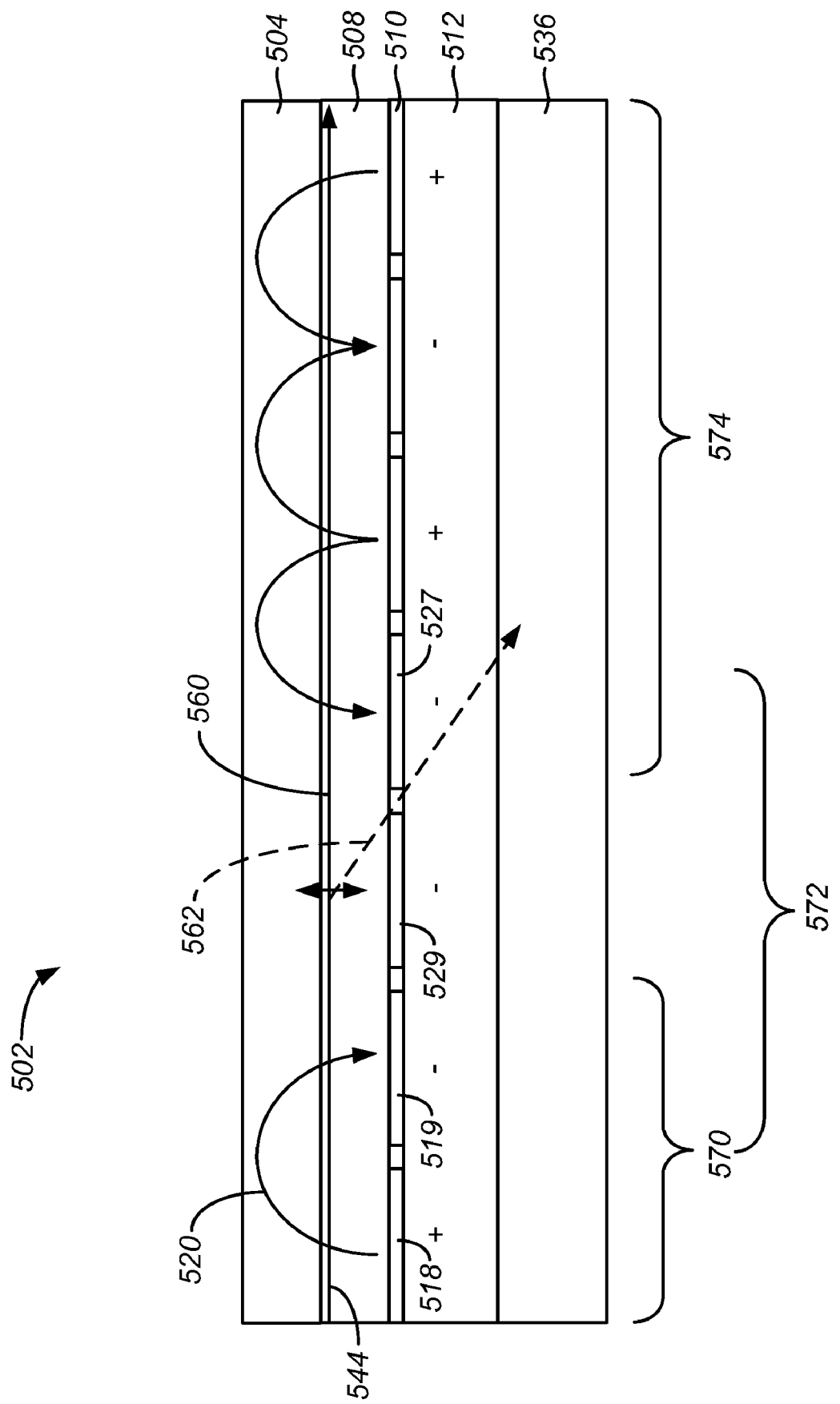

OPTICALLY BASED PLANAR SCANNER

CROSS-REFERENCE TO RELATED APPLICATION

This application claims benefit under 35 U.S.C. 119(e) to Provisional Application No. 61/241,546, filed Sep. 11, 2009, and entitled "OPTICALLY BASED PLANAR SCANNER." The provisional application is incorporated by reference in its entirety.

BACKGROUND

Current forensic quality biometric scanners use conventional optics technology consisting of lenses, mirrors, prisms, and optical sensors. Images of objects that are scanned with these systems can have excellent image quality. The three-dimensional nature of the optical path in such forensic quality biometric scanners, however, results in relatively large, heavy systems. Further, the three-dimensional nature of the optical path often requires a significant amount of illumination of the object being scanned, resulting in such systems using a large amount of power.

SUMMARY

Disclosed are apparatus and methods for providing an optically based planar scanner for generating an image. The disclosed optically based planar scanner apparatus and methods use switchable Bragg gratings.

In one embodiment of the invention, an apparatus configured to scan an image includes a light source configured to provide light, a light detector configured to detect the light, a platen, a waveguide, a reflection grating, and a switchable Bragg grating. An area of the switchable Bragg grating is configured to be activated to direct the light through the reflection grating and the waveguide to the platen. The platen is configured to reflect the light via total internal reflection though the waveguide to the reflection grating or to refract the light. The reflection grating is configured to reflect the light reflected from the platen to the waveguide. The waveguide is configured to guide the light to the light detector.

In another embodiment of the invention, an apparatus configured to scan an image and to receive input includes a light source configured to provide light, a light detector configured to detect the light, a platen, a waveguide located under the platen, a reflection grating located under the waveguide, and a switchable Bragg grating located under the reflection grating. The platen, the waveguide, the reflection grating, and the switchable Bragg grating are transparent. The apparatus further includes a display configured to be visible to a user of the apparatus and to display an input selection. The display is located under the switchable Bragg grating. An area of the switchable Bragg grating is configured to be activated to direct the light through the reflection grating and the waveguide to the platen. The platen is configured to reflect the light via total internal reflection though the waveguide to the reflection grating or to refract the light. The reflection grating is configured to reflect the light reflected from the platen to the waveguide. The waveguide is configured to guide the light to the light detector.

In yet another embodiment of the invention, a method of scanning an image includes providing light to a switchable Bragg grating. An area of the switchable Bragg grating is activated to direct the light through a reflection grating and a waveguide to a platen. The light is reflected via total internal reflection from a surface of the platen or is refracted into an object contacting the surface of the platen. The reflected light is directed through the waveguide to the reflection grating. The reflected light is reflected from the reflection grating to the waveguide. The reflected light is guided with the waveguide to a detector.

In a further embodiment of the invention, an apparatus configured to scan an image includes a light source configured to provide light, a light detector configured to detect the light, an object receiving surface, a first plurality of switchable Bragg grating components arranged to form a first layer, and a second plurality of switchable Bragg grating components arranged to form a second layer. Areas of the first plurality of switchable Bragg grating components are configured to be activated to direct the light to the object receiving surface. The object receiving surface is configured to reflect the light via total internal reflection though the first switchable Bragg grating components to activated areas of the second plurality of switchable Bragg grating components or to refract the light. The activated areas of the second switchable Bragg grating components are configured to direct the light towards the light detector.

In another further embodiment of the invention, an apparatus configured to scan an image includes a light source configured to provide light, a light detector configured to detect the light, a platen, a switchable Bragg grating, a glass layer, a waveguide, and a reflection grating. An area of the switchable Bragg grating is configured to be activated such that light is taken out of total internal reflection with the switchable Bragg grating. The platen is configured to reflect the light taken out of total internal reflection with the switchable Bragg grating via total internal refection though the waveguide to the reflection grating. The reflection grating is configured to reflect the light reflected from the platen to the waveguide. The waveguide is configured to guide the light to the light detector.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 4C schematically illustrates the light path in the planar scanner of FIG. 4A when the scanner is in operation.

FIG. 5B schematically illustrates the light path in the planar scanner of FIG. 5A when the scanner is in operation.

DETAILED DESCRIPTION

The invention relates to optically based planar scanner apparatus and methods, and in particular, to optically based planar scanner apparatus and methods using switchable Bragg gratings for capturing fingerprints, palm prints, and hand prints.

Mobile scanners for capturing fingerprint, palm print, and hand print images are beginning to demand larger, higher quality images, functionality achieving that of forensic quality scanners. Other requirements for mobile scanners include small form factors, low weight, and low power consumption that can be supplied by batteries, for example. One technical approach to reducing the size of current scanning systems is to collapse the system into more of a two-dimensional configuration.

The disclosed optically based planar scanner apparatus and methods use switchable Bragg gratings. Commercial manufacturers of switchable Bragg gratings include SBG Labs Inc. (Sunnyvale, Calif.).

Switchable Bragg gratings (SBGs) are materials with a functionality that allows the transmission or diffraction characteristics of the switchable Bragg grating (SBG) to be altered based on the presence of an electrical field. SBGs are commonly used in the display and communication industries. Some SBGs are manufactured by mixing fine droplets of a liquid crystal material in a monomer. The mixture is exposed to structured laser light that polymerizes the monomer and also arranges the liquid crystal droplets in specific patterns. After formation of such a SBG, applying a voltage across the SBG orients the liquid crystal droplets, changing the optical properties of the SBG in the area in which the voltage is applied.

Figure 1:
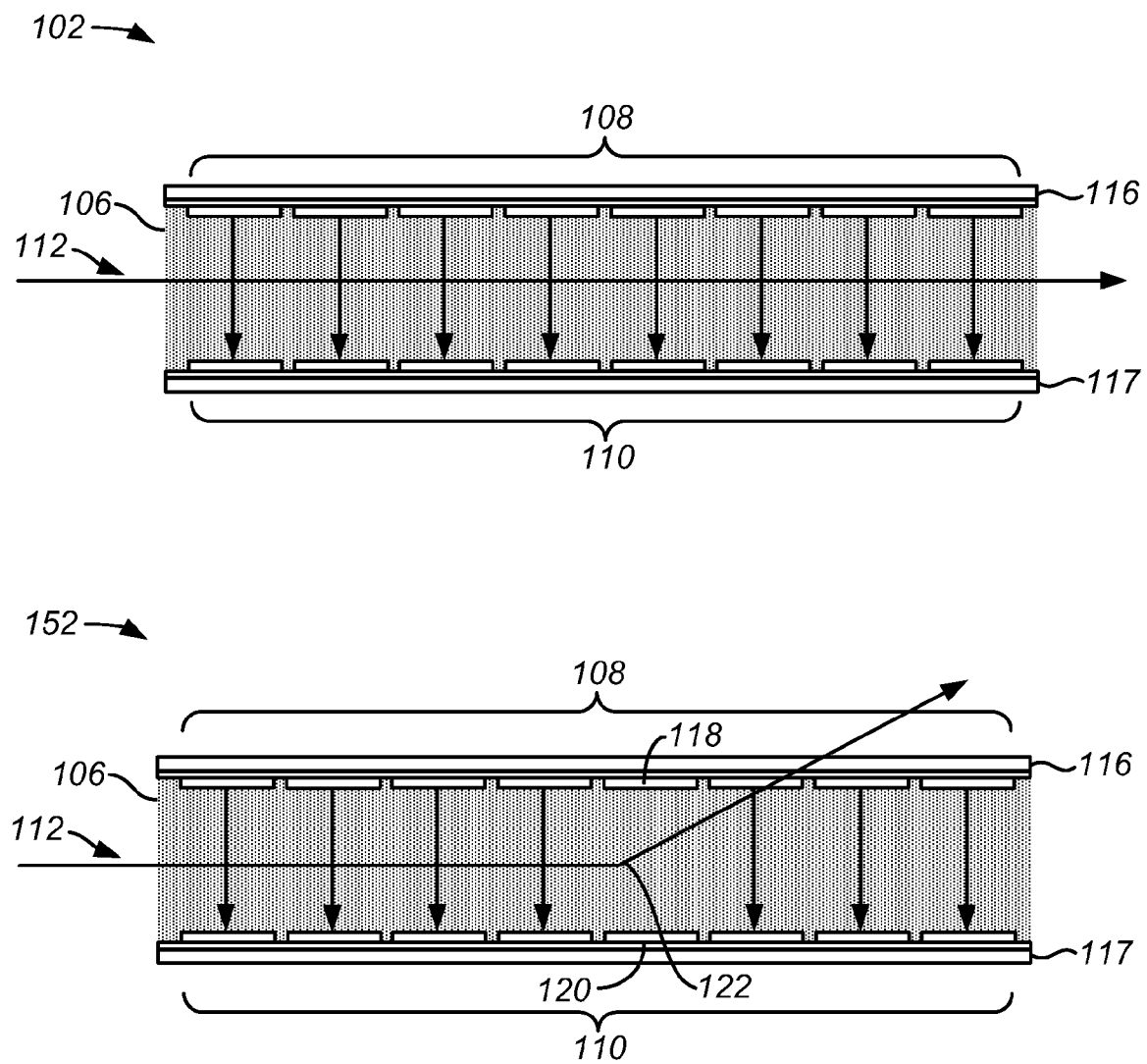
FIG. 1 schematically illustrates the operation of a switchable Bragg grating.

FIG. 1 schematically illustrates the operation of a SBG. In view 102 and view 152, an SBG 106 has a plurality of electrodes 108 on one side and a plurality of electrodes 110 on the other side. Each electrode of the plurality of electrodes 108 corresponds to another electrode of the plurality of electrodes 110. Alternatively, the SBG 106 has a plurality of electrodes 108 on one side and a single reference electrode (not shown) on the other side. Also on each side of the SBG 106 are a top glass 116 and a bottom glass 117. In both view 102 and view 152, light 112 (represented as a line) may travel down the SBG 106 via total internal reflection between the top glass 116 and the bottom glass 117.

In view 102, an electric field (represented by the vertical arrows) is generated between each electrode of the plurality of electrodes 108 and its corresponding electrode of the plurality of electrodes 110. Alternatively, an electric field is generated between each electrode of the plurality of electrodes 108 and the single reference electrode; the single reference electrode spans the same area as the plurality of electrodes 110, but is a single electrode instead of individual electrodes. In some SBGs, the electric field generated across the SBG is an AC electric field. The electric field present between each electrode of electrodes 108 and its corresponding electrode of electrodes 110 of the SBG 106 results in light 112 being transmitted down the SBG 106; i.e., the SBG is not activated and is in a transparent state. When the electric field is removed from between a pair of electrodes by removing the potential applied across those electrodes, the SBG diffracts the light at an angle determined by the processing conditions that were used to create the SBG; i.e., the SBG is activated and is in a diffraction state. In view 152, electrode 118 and its corresponding electrode 120 do not have an AC electric field generated between them, and light 112 is diffracted in the area of the SBG located between the electrodes at area 122.

SBGs fabricated using nano-dispersed liquid crystal material have very fast switching times (e.g., about 100 microseconds) between the transparent state and the diffraction state. SBGs interact with light at a specific wavelength or range of wavelengths.

Figure 2A:
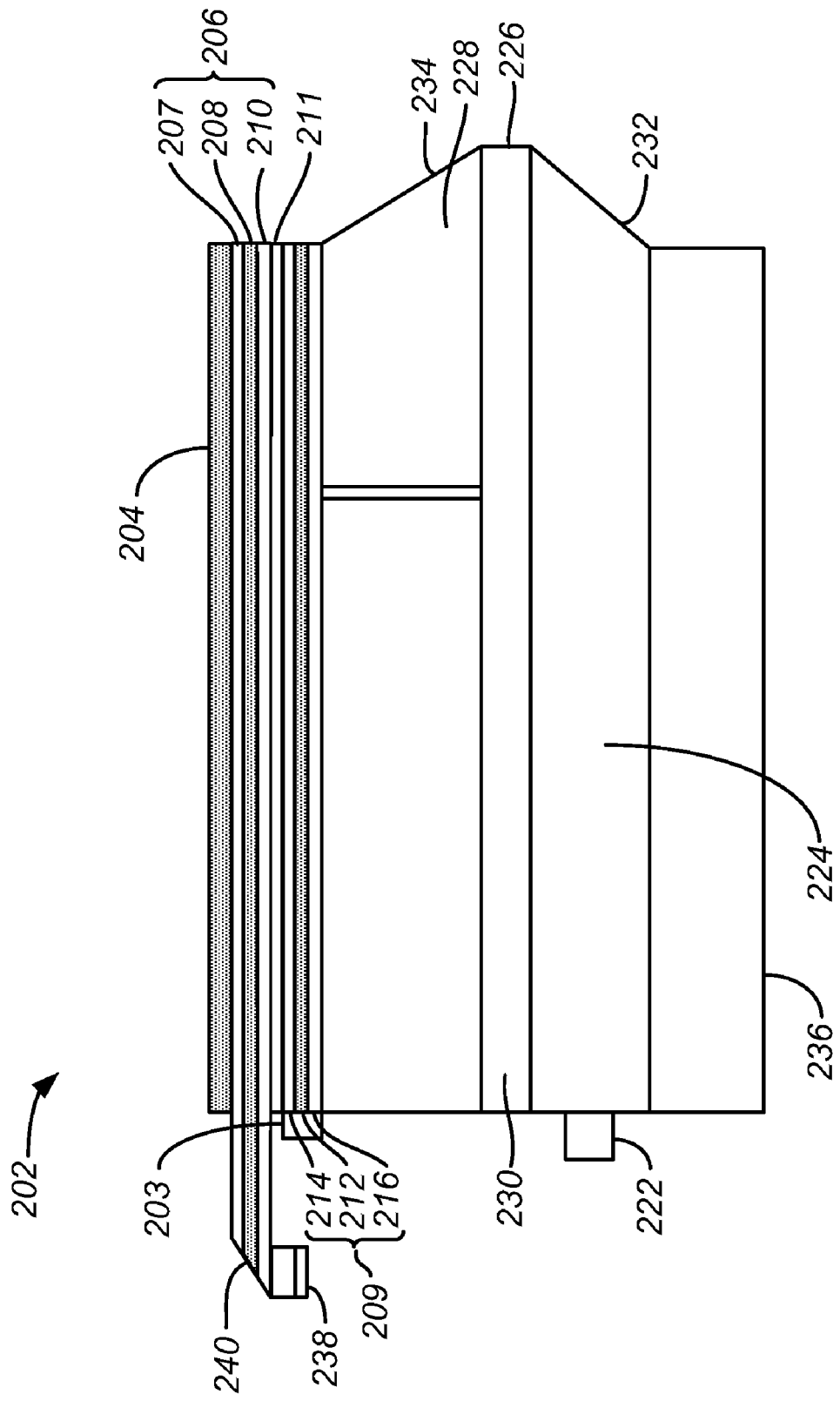
FIG. 2A schematically illustrates a side view of an optically based planar scanner according to one embodiment of the present invention.

FIG. 2A schematically illustrates a side view of an optically based planar scanner according to one embodiment of the present invention. A scanner 202 includes a platen or object receiving surface 204, a waveguide 206, a reflection grating 211, an SBG stack 209, an optical material 230, a transmitting material 228, a polarizer 226, beam spreading and collimating optics 224, a display 236, a light detector 238, and a light source 222. The SBG stack 209 includes a top glass 214, an SBG 212, and a bottom glass 216. The waveguide 206 includes a waveguide core 208 and waveguide cladding 207 and 210 on either side of the waveguide core 208.

In some embodiments of the invention, the light source 222 is a laser that produces light in the visible portion of the electromagnetic spectrum (i.e., between about 380 to 760 nanometers) or light in a portion of the electromagnetic spectrum that is not visible. Using a laser that produces light in a portion of the electromagnetic spectrum that is not visible may be important when the scanner is operated in situations where avoiding detection is important. For example, using light that is not visible may be important in a theater of war. In some embodiments, the laser of the illumination system is an infrared laser (e.g., configured to produce light with a wavelength of about 785 nanometers). Light from the laser first passes through the beam spreading and collimating optics 224. In some embodiments, the beam spreading and collimating optics are about 1 millimeter thick. The beam spreading optics form the narrow, low-divergence beam of light emitted from the laser into a plane of laser light (i.e., a plane extending into the page of FIG. 2A). The collimating optics serve to collimate the plane of laser light. Collimated light is light with rays that are nearly parallel and spread slowly as the light propagates. The importance of collimating the light is discussed further below.

After passing though the beam spreading and collimating optics 224, the collimated plane of laser light is reflected off of a surface 232 of the beam spreading and collimating optics 224. The surface 232 may be a surface that is reflective in the wavelength of the light or the light may reflect off of the surface 232 due to total internal reflection. After the light is reflected from the surface 232, the light passes though the polarizer 226 where it is polarized. In some embodiments of the invention, the polarizer is about 50 to 100 micrometers thick. The importance of polarizing the light is discussed further below. The light then passes into the transmitting material 228 and is reflected off of a surface 234 of the transmitting material 228. The surface 234 may be similar to the surface 232. After the light is reflected from the surface 234, the light passes through the transmitting material 228 and into the SBG stack 209. In some embodiments of the invention, the transmitting material 228 is about 1.3 millimeters thick. The index of refraction of the transmitting material 228 is configured such that no or little reflection occurs as the light travels through the bottom glass 216 into the SBG 212 of the SBG stack 209.

Figure 2B:
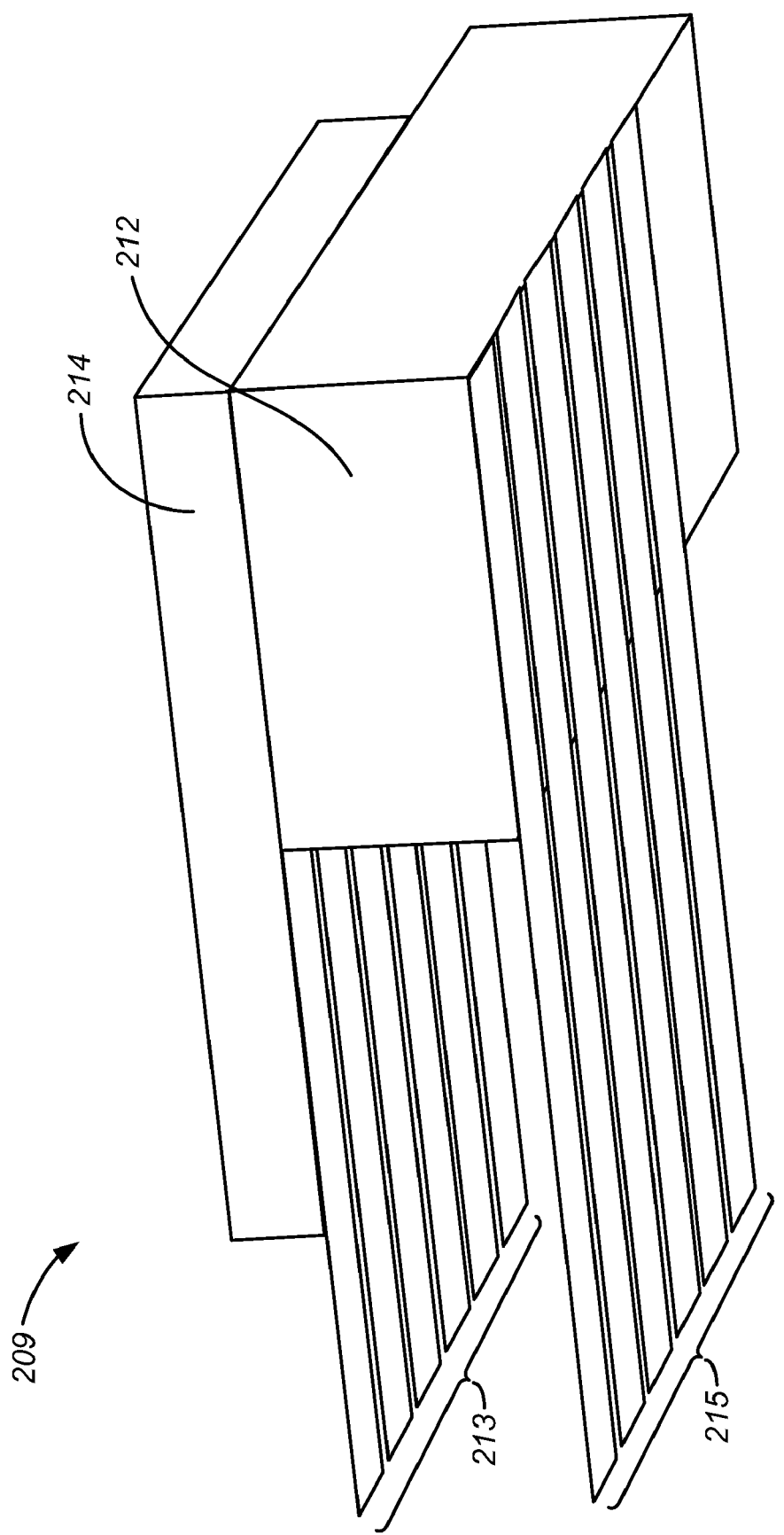
FIG. 2B schematically illustrates an enlarged view of the switchable Bragg grating stack of the planar scanner of FIG. 2A.

FIG. 2B schematically illustrates an enlarged view of the SBG stack 209 of the scanner 202 of FIG. 2A according to one embodiment of the invention. The SBG stack 209 includes the top glass 214, a plurality of electrodes 213 on the top surface of the SBG 212, a plurality of electrodes 215 on the bottom surface of the SBG 212, and the bottom glass 216 (not shown). In some embodiments, the plurality of electrodes 215 on the bottom surface of the SBG 212 is replaced with a single reference electrode (not shown), as described above. In some embodiments, the electrodes are a transparent conducting oxide. In a specific embodiment, the transparent conducting oxide is indium tin oxide. The electrodes are about 200 to 300 nanometers thick, in certain embodiments. The electrodes are about 2 mils wide (2/1000 of an inch), in some embodiments; the width of the electrodes determines the resolution of images generated with the scanner 202, as discussed further below. The SBG 212 is about 3 to 12 micrometers thick, in certain embodiments. In a specific embodiment, the SBG 212 is about 4 micrometers thick. The top glass 214 and the bottom glass 216 are each about 50 to 500 micrometers thick, in certain embodiments. In a specific embodiment, the top glass and the bottom glass are each about 300 micrometers thick. From the perspective of FIG. 2B, light from the transmitting material 228 (FIG. 2A) travels though the SBG 212, into the plane of the page of FIG. 2B. From the perspective of FIG. 2A, the electrodes 213 and the electrodes 215 extend into the plane of the page of FIG. 2A.

As explained in relation to FIG. 1, each electrode of the plurality of electrodes 213 corresponds to an electrode of the plurality of electrodes 215. In operation, when an AC electric field of sufficient strength is generated between all of the pairs of electrodes of the electrodes 213 and 215, all of the areas of the SBG 212 are in a transparent state. An AC electric field created with a potential that has a magnitude of about 50 volts and a frequency of about 1 kilo-Hertz or higher is suitable for some SBGs, in some embodiments of the invention. Light from the transmitting material 228 enters the SBG stack 209 at an angle such that the light is reflected via total internal reflection between the top glass 214 and the bottom glass 216 of the SBG stack 209 when all of the areas of the SBG 212 are in a transparent state.

In further embodiments of the invention, the SBG stack 209 includes a second plurality of electrodes (not shown) on the top surface of the SBG 212 and a second plurality of electrodes on the bottom surface of the SBG 212. These second pluralities of electrodes are perpendicular to the electrodes 213 and 215, in some embodiments. Each electrode of the second plurality of electrodes on the top surface of the SBG corresponds to an electrode of the second plurality of electrodes on the bottom surface of the SBG. With these second pluralities of electrodes, strips of the SBG material perpendicular to electrodes 213 and 215 can be in a diffraction state with no light being transmitted down these strips. This is useful in some applications where control of platen illumination on a pixel by pixel basis is desired, such as the detection of fake finger models that may be used to generate a finger print, as described below.

Figure 2C:
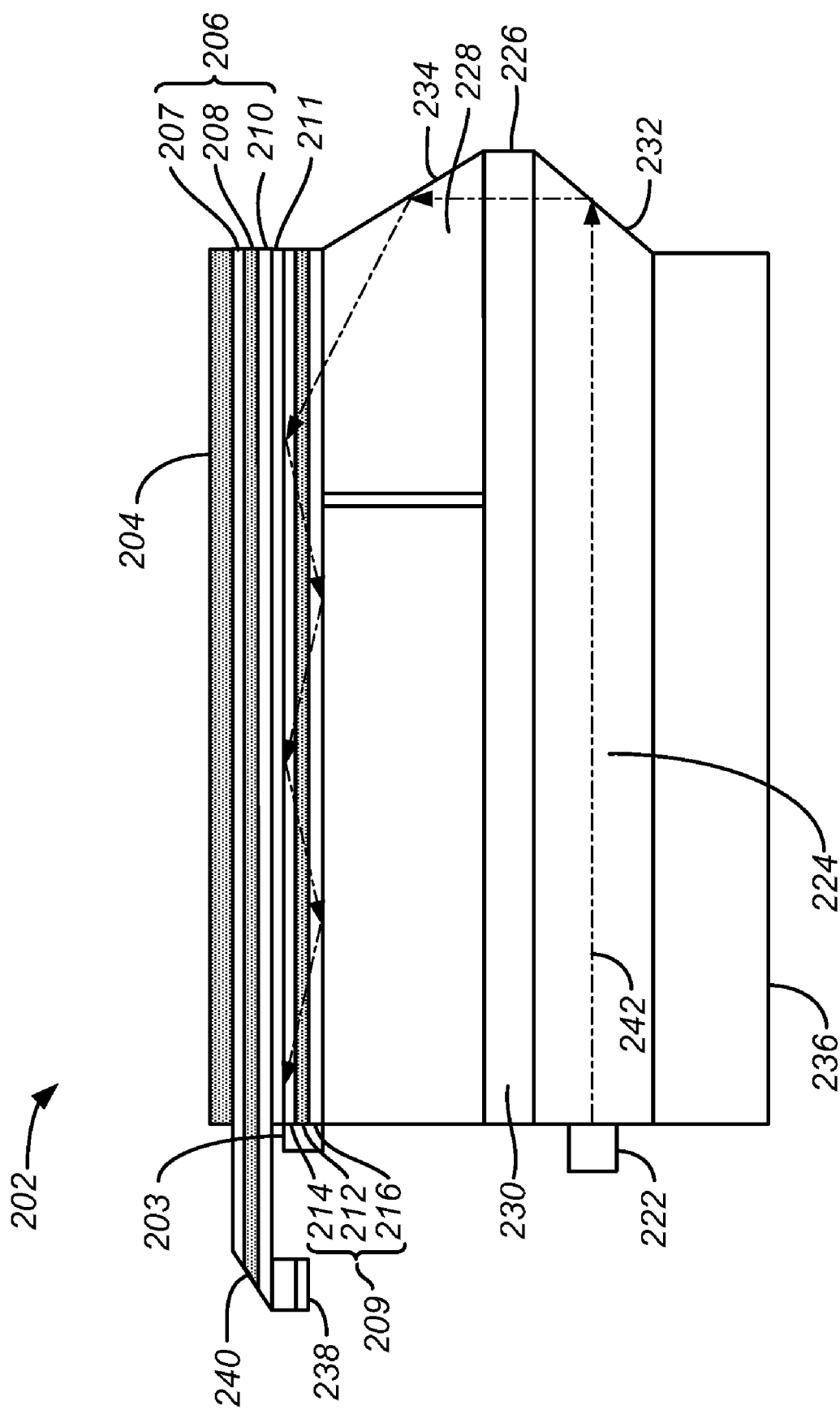
FIG. 2C schematically illustrates the light path in the planar scanner of FIG. 2A when an area of the switchable Bragg grating is not activated.

FIG. 2C schematically illustrates the path of light 242 from the light source 222 in the scanner of FIG. 2A when an area of SBG 212 is not activated and all areas are in a transparent state. Light 242 remains in the SBG stack 209 and is not detected by the light detector 238. The optical material 230 has an index of refraction such that total internal reflection of light 242 occurs within the SBG stack 209. The light travels, trapped in total internal reflection, from the right end to the left end of the SBG stack 209 where it encounters a light dump 203 which consists of a light absorbing material that absorbs substantially all of the light.

When, however, a pair of electrodes of the electrodes 213 and the electrodes 215 has no AC electric field generated between the pair, the area of the SBG 212 between the pair of electrodes is activated and in a diffraction state. When an area of the SBG 212 is in a diffraction state, the SBG directs the light at such an angle that it is taken out of total internal reflection between the top glass 214 and the bottom glass 216 of the SBG stack 209.

Figure 2D:
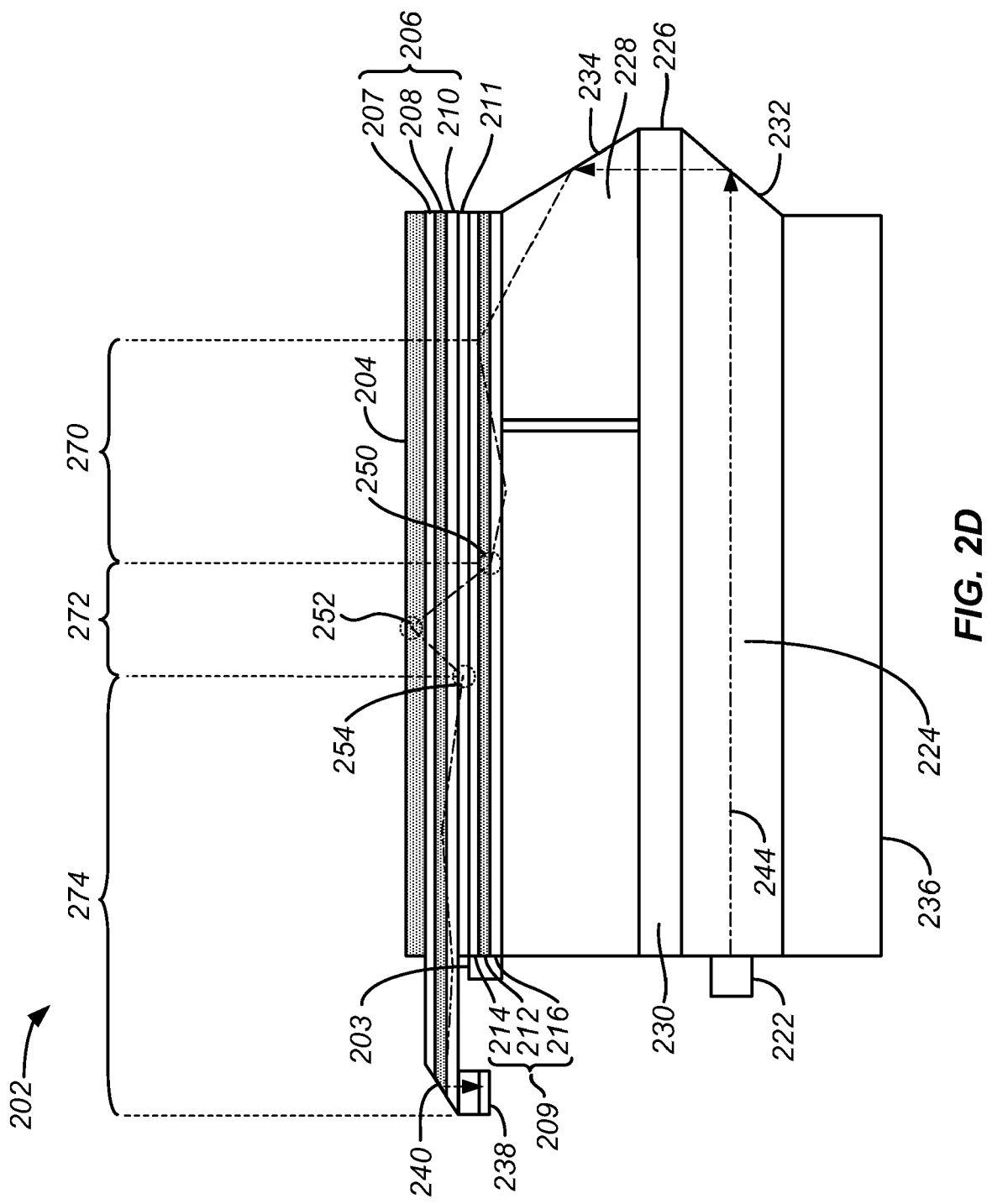
FIG. 2D schematically illustrates the light path in the planar scanner of FIG. 2A when an area of the switchable Bragg grating is activated.

FIG. 2D schematically illustrates the path of light 244 from the light source 222 in the scanner of FIG. 2A when an area of the SBG 212 is activated and in a diffraction state. In FIG. 2D, an area of the SBG 212 is activated at region 250 and the light is taken out of total internal reflection between the top glass 214 and the bottom glass 216.

When the light is taken out of total internal reflection at region 250, the light travels through the reflection grating 211 and the waveguide 206 to the surface of the platen 204. If an object is not in contact with the surface of the platen 204 at region 252 where the light interacts with the surface of the platen, total internal reflection occurs at the surface of the platen and the light is reflected back through the waveguide 206. If, however, an object is in contact with the surface of the platen 204 at region 252 where the light interacts with the surface of the platen, a portion of the light may be refracted into the object and a portion of the light may reflected via total internal reflection. Further, all of the light might be refracted into the object.

The light, or portion thereof, that is reflected from the surface of the platen 204 is reflected through the waveguide 206 to the reflection grating 211. At the reflection grating 211 at region 254, the light is reflected into the waveguide 206. The reflection grating is selected such that it reflects the wavelength of light provided by the laser. In some embodiments of the invention, the reflection grating is about 50 micrometers thick. Light of different polarizations may interact with reflection gratings such that light of different polarizations may be reflected with different efficiencies. The polarizer 226 polarizes the light (i.e., the light is in one polarization) such that the light is reflected with the reflection grating with no intensity variations due to different polarizations. As such, the variations in light intensity measured by the light detector (described further, below) are due to the differences in light interaction at the surface of the platen, and not due to other components of the scanner 202.

The waveguide 206 guides the light from the reflection grating 211 to the light detector 238 via total internal reflection. Waveguides are generally functional over a wide range of wavelengths of light. The waveguide 206, as noted, generally includes a waveguide core 208 which is about 40 micrometers thick, and waveguide cladding (207, 210) on either side of the waveguide core, the waveguide cladding being about 60 micrometers thick. Before reaching the light detector 238, the light is reflected off of the surface 240 of the waveguide 206. The surface 240 may be similar to surfaces 232 and 234.

Figure 2E:
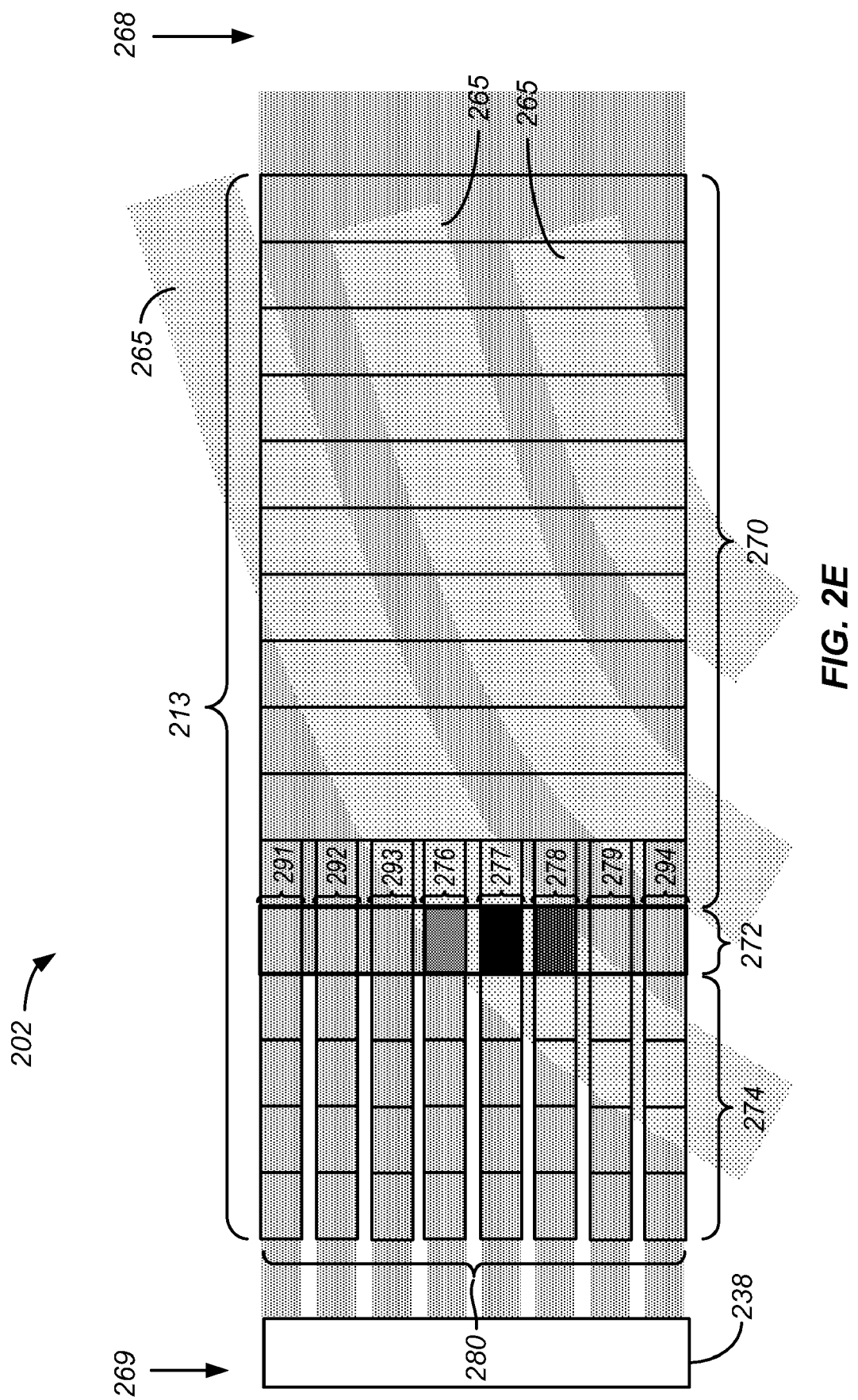
FIG. 2E schematically illustrates a top view of a portion of the planar scanner of FIG. 2A.

FIG. 2E schematically illustrates a top view of a portion of the scanner 202 of FIG. 2A. 14 inch by 14 inch panels of SBG material can be fabricated, so a scanner with a large platen can be contemplated. Further, the platen for the scanner 202 can be large enough to generate a palm or a hand print; scanners with smaller platens could also be manufactured. For example, an about 3.2 by 3.0 inch platen would be large enough for a scanner configured to generate four finger slap image.

In FIG. 2E, light is traveling from the right hand side 268 of the figure to the left hand side 269 of the figure, similar to FIGS. 2C and 2D. The light is a collimated plane of light that was generated by the beam spreading and collimating optics 224. In FIG. 2E, an object that would be in contact with the platen 204 is shown. In this instance, the object in contact with the platen 204 is a finger tip with fingerprint ridges 265. Also shown in FIG. 2E are three different regions, 270, 272, and 274. The path of the plane of light in region 272 of FIG. 2E corresponds to regions 250, 252, and 254 of FIG. 2D.

In FIG. 2E, the electrodes 213 and the electrodes 215 are approximately perpendicular to the direction in which the light is traveling; i.e., the plurality of pairs of electrodes of the electrodes 213 and the electrodes 215 are represented by the vertical columns in FIG. 2E. From the perspective of FIG. 2E, only the electrodes 213 are visible, and the SBG 212 and the electrodes 215 are underneath the electrodes 213. In region 270, the collimated plane of light is traveling through the SBG stack 209 via total internal refection due to all of the electrode pairs of the electrodes 213 and the electrodes 215 in this region having an AC field generated between them (i.e., the SBG 212 is not activated and is in a transparent state). Because the light is collimated, it travels in an approximately straight line (from right to left) in region 270, without spreading. In region 272, an area of the SBG 212 is activated by a pair of electrodes of the electrodes 213 and the electrodes 215 not having an AC electric field generated between them. As described above, when an area of the SBG 212 is activated and in a diffraction state, the plane of light is taken out of total internal reflection. The plane of light travels through the reflection grating 211 and the waveguide 206, to the surface of the platen 204.

In areas 291, 292, 293, and 294, no object is contacting the surface of the platen 204; all of the light is reflected from the surface of platen 204 via total internal reflection. The reflected light travels through the waveguide 206 to the reflection grating 211, where the light is reflected into the waveguide 206. In region 274, the waveguide 206 guides the light to the light detector 238. For each of the areas 291, 292, 293, and 294, the light detector 238 measures substantially the same intensity of light after the interaction of the light with the surface of the platen; the light in areas 291, 292, 293, and 294 has identical paths through the scanner 202, and no light is lost due to refraction into an object on the surface of the platen 204.

In areas 276-279, however, an object (i.e., fingerprint ridges 265) is in contact with the surface of the platen 204. Some of the light in these regions is refracted into the fingerprint ridges 265, and some of the light is reflected from the surface of the platen 204 via total internal reflection, depending on the percentage of the platen that is in contact with the fingerprint ridges 265 corresponding to the activated area of SBG 212. For instance, area 277 is entirely covered by the fingerprint ridges 265, and most or all of the light in this region would be refracted into the fingerprint ridge. Area 279 is covered by a small portion of the fingerprint ridges 265, and a large portion of the light in this region would be reflected from the surface of the platen 204. For areas 276-279, the light that is reflected from the surface of the platen 204 travels though the waveguide 206 to the reflection grating 211, where the light is reflected into the waveguide 206. In region 274, the waveguide 206 guides the light to the light detector 238. For area 277, for example, the light detector 238 would measure a very low intensity of light. For area 279, for example, the light detector 238 would measure an intensity of light higher than that measured for area 277, but lower than that measured for area 275.

In some embodiments of the invention, to insure that the plane of light does not decollimate and spread after interaction with surface of the platen 204, the waveguide 206 is a waveguide that separates the plane of light into a plurality of discrete paths 280. These discrete paths are represented by the horizontal rows in FIG. 2E. The width and spacing of these discrete paths 280 determines the resolution of the scanner 202. Each discrete path is about 2 mils wide (²⁄₁₀₀₀ of an inch), in some embodiments. By confining the plane of light to discrete paths, the light will not decollimate and spread, which would degrade the resolution of the scanner 202. For example, if the light did decollimate and spread, light from area 276 might spread into areas 293 and 277; such decollimation would occur for all of the areas (i.e., areas 276, 277, 278, 279, 291, 292, 293, and 294) and degrade the resolution of the scanner 202. The waveguide 206 guides the discretized paths of light to the detector 238.

The light detector 238 is a linear optical sensor array, in some embodiments. The light detector 238 may include a complementary metal-oxide-semiconductor (CMOS) sensor, a charge coupled device (CCD) sensor, or other semiconductor sensors. Each discrete path in the waveguide 206 is coupled to a specific area of the light detector 238, in some embodiments of the invention. For example, in some embodiments of the invention, each discrete path is coupled to a pixel of the light detector; i.e., there is one pixel location in the light detector 238 for each discrete path 280 in the waveguide. In other embodiments of the invention, multiple detector pixels correspond to each discrete path 280 in the waveguide. In further embodiments of the invention, the light detector 238 may include multiple optical sensor arrays or a two-dimensional optical sensor array. A two-dimensional optical sensor array may be easier to align with a discrete path 280 in the waveguide compared to aligning a pixel of a linear optical sensor array with a discrete path in the waveguide. When such a two-dimensional optical sensor array is used, software and a computing system may be used to determine onto which area of the two-dimensional optical sensor array a discrete path in the waveguide is projecting light.

For each activated pair of the electrodes 213 and 215 of the scanner 202, the light detector 238 is configured to measure the intensity of light for each discrete path of light. By activating each of the areas of the SBG 212 and measuring and storing the intensity of light associated with each activated area, an image of an object contacting the surface of the platen 204 may be generated, i.e., the scanner 202 captures one-dimensional images of the object that may then be used to generate a two-dimensional image of the object. For example, the intensities of light may be stored in a computer memory. The one-dimensional intensities of light may then be assembled by a computer to generate an image. By way of analogy, the light detector 238 may be viewed as a single column of a two-dimensional light detector found in digital cameras, for example. The scanner 202, in contrast to a digital camera, captures a discrete column of an image of an object contacting the surface of the platen 204 instead of capturing an entire image at time, as is possible with a digital camera.

Linear sensor arrays are generally faster at capturing a one-dimensional image than a two-dimensional array is at capturing a two-dimensional image. In operation, an area of the SBG needs to be activated long enough such that enough light is directed to the light detector to enable the light detector to measure a sufficient integrated intensity. In some embodiments of the invention, the dwell time for each activated area of the SBG 212 is about 10 to 100 microseconds; i.e., each area of SBG 212 is activated for about 10 to 100 microseconds. This allows the plane of light to interact with the surface of the platen 204 for about 50 to 100 microseconds and the light detector to collect the integrated intensity of light for this time period.

Further, as also mentioned above, the width and spacing of the pairs of the electrodes 213 and 215 and the width and spacing of the discrete paths 280 in the waveguide 206 determine the resolution of the scanner 202. With electrode pairs of about 2 mils in width and the discrete paths of the waveguide about 2 mils in width, a resolution of an image of an objects in contact with the surface of the platen 204 is about 500 pixels per inch (ppi). The resolution of images may be improved by reducing the width and spacing of the electrodes or the width and spacing of the discrete waveguide paths, in further embodiments of the invention.

The short dwell time required for the light detector, the fast switching time of the SBG, and the high resolution of the images that may be generated allows forensic quality images to be generated in a short period of time. For example, rolled fingerprint images may be generated with a 3.2 inch by 3.0 inch platen 204 of the scanner 202 according to the disclosed embodiments of the invention. To generate a rolled fingerprint image, the scanner 202 needs to generate at least about 12 images of the object being scanned per second. In generating 12 images per second, areas of the SBG that span an area large enough to image the rolled print need to be activated and the light from each of the areas collected; this is made possible by the short actuation and sensing times required by the components of the scanner 202, as described above. The scanner 202 may also be operated at slower and faster image collection rates.

As described above, in some embodiments of the invention, the scanner 202 includes a display 236 that is configured to be visible from a surface of the platen 204. The scanner 202 may include a display 236 in embodiments in which the platen 204, the waveguide 206, the reflection grating 211, the SBG stack 209, and other components located between the platen surface and the display 236 are substantially transparent. The display 236 may be a LCD display, a LED display, or other electronic displays. In some embodiments, the display 236 may be used to display information configured to be visible on the surface of the platen 204. For example, the display 236 may display operation instructions for a user of the scanner 202. The display may also be used as a feedback mechanism to display an image of an object that was in contact with the surface of the platen 204; e.g., the scanner 202 could be used to collect a fingerprint image, and then the fingerprint image could be displayed. This would allow a user of the scanner 202 to easily check images collected with the scanner for quality. The display 236 could also provide feedback during image capture to enhance the image capture process.

In further embodiments of the invention, the scanner 202 is also configured as an input device. When the scanner 202 is generating a number of images per second, the area of the platen being contacted with an object (e.g., a finger) may be determined using a computer, for example. The computer generates images of the platen, and the computer is configured to determine when an object is contacting the surface of the platen 204 and/or the area of the surface of the platen 204 that is being contacted with the object. Thus, the scanner 202 may function as a touch screen sensor without any additional sensor components (e.g., a capacitive touch screen). For example, the scanner 202 collecting 10 images per second would be fast enough for it to act as a touch sensor, but the scanner collecting one image per second would likely not be fast enough; with one image being collected a second, a user would have to contact the surface of the platen with an object for one second or longer before the scanner could determine that the surface was being contacted. In such embodiments of the invention, the display 236 is configured to display input selections. Input selections might be selections for the operation of the scanner 202 (e.g., "scan image" and "erase image") or a QWERTY keypad. The display 236 coupled with the ability to sense areas of the platen being contacted would function as the input mechanism for the scanner, obviating the need for a separate key pad or other input device.

When the scanner 202 is configured as an input device in some embodiments of the invention, the resolution of the images of the platen that are generated is not important. For example, it is possible to collect lower resolution images of the surface of platen 204 by activating selected areas of the SBG 208. For example, by activating each fifth pair of electrodes of the electrodes 213 and 215, a lower resolution would be generated, but this would enable the scanner 202 to generate an image of the platen in a shorter time period than when each pair of electrodes is activated.

Further, the scanner 202, when configured as an input device, may collect a fingerprint image without a person knowing that their fingerprint image is being collected. For example, the scanner 202 could be configured as an input device of a computer screen (instead of using other touch screen technologies, for instance). Then, whenever a person touched the screen to make a selection on the screen of the computer, a fingerprint image could be collected.

Further, the scanner 202, when configured as an input device, may collect a fingerprint image at the same time it collects input information. Action to be taken based on the input selection can be qualified by whether the fingerprint that was captured belonged to an individual that was authorized to use the input selection, for example.

Figure 3:
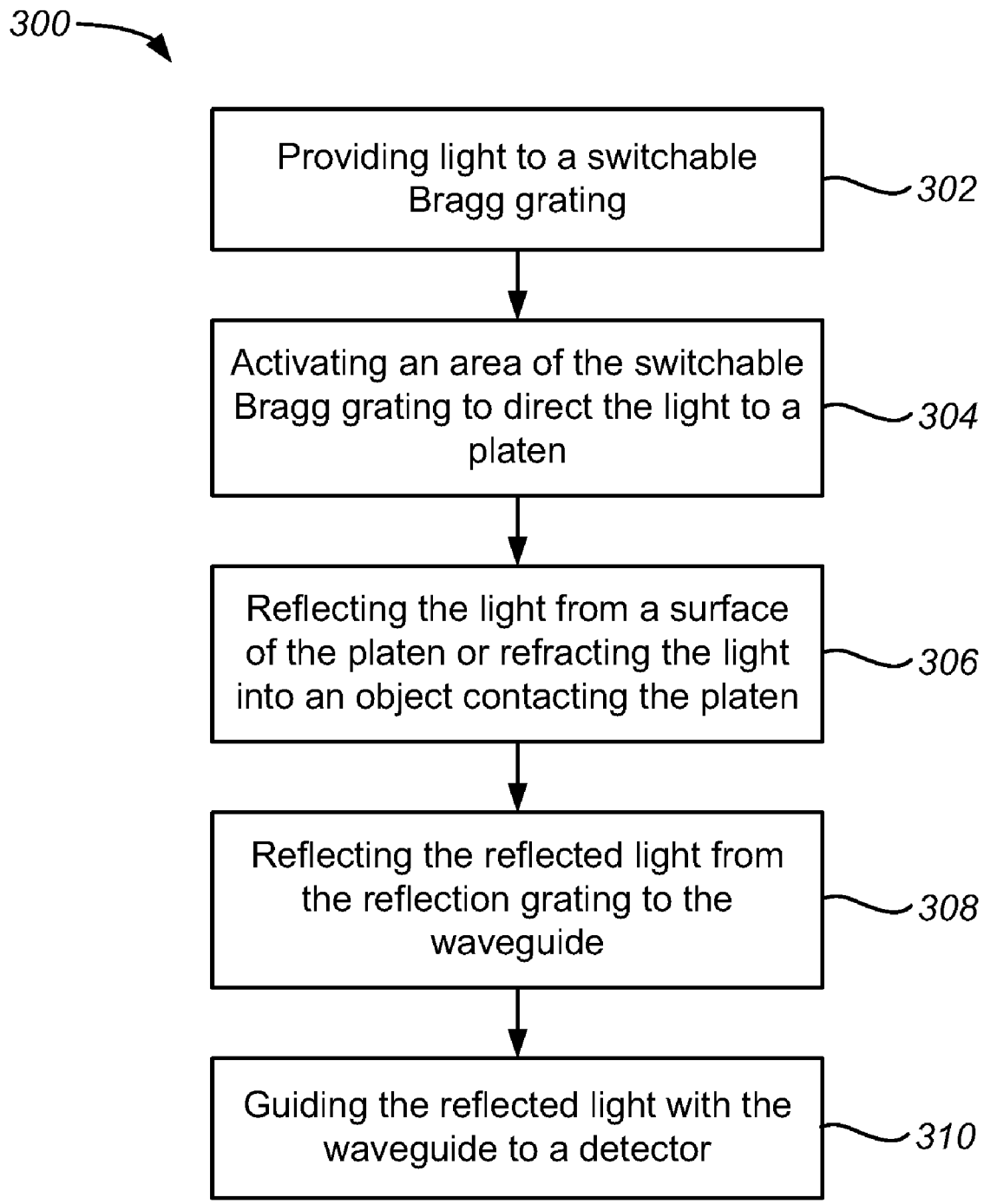
FIG. 3 is a flowchart for an optically based planar scanning method according to one embodiment of the present invention.

FIG. 3 is a flowchart for an optically based planar scanning method 300 according to one embodiment of the present invention. In 302, light is provided to a SBG. In certain embodiments of the invention, when the light is provided by a laser, the light is collimated and expanded before providing the light to the SBG, producing a plane of laser light. In further embodiments, the light is passed through a polarizer before providing the light to the SBG. Passing the light through a polarizer helps to ensure that there are no variations in the light interaction with the SBG and a reflection grating due to polarization differences in the light.

In 304, an area of the SBG is activated to direct the light to a platen. As described above, an area of the SBG may be activated by removing the AC field generated by two electrodes on either side of the SBG. Before the light reaches a surface of the platen, the light passes though a reflection grating and a waveguide.

In 306, the light is reflected from the surface of the platen via total internal reflection or is refracted into an object contacting the surface of the platen. The reflected light is directed through the waveguide to the reflection grating. The amount of light reflected versus the amount of light refracted is a function of the amount that the object covers the platen at the associated region of the activated area of the SBG; if the object covers a large percentage of the region, a large percentage of the light will be refracted into the object. In contrast, if the object covers a small percentage of the region, a small percentage of the light will be refracted into the object.

In 308, the reflected light is reflected from the reflection grating to the waveguide. In 310, the reflected light is guided to a light detector with the waveguide.

The SBG includes a plurality of areas configured to be activated. To generate an image of an object contacting the platen, 304 though 310 are repeated for each area of the SBG configured to be activated. After each repetition of 304 through 310, the intensity of the light is measured with the light detector. The measured intensity of the light is then stored. For example, the measured intensities may be stored in a computer memory. Using the stored measured intensities of the light, an image of the object contacting the platen may be generated.

In certain embodiments of the invention, an input selection is rendered with a display. The input selection is visible from the surface of the platen. Using the scanning technique described above, the selection of the input selection is detected. In one embodiment, the selection of an input selection is detected by repeating 304 through 310 for each area of the SBG configured to be activated. After each repetition of 304 through 310, the intensity of the light is measured with the light detector. The measured intensities can be used to generate an image of an object, if any, contacting the platen. From an image, a region of the platen being contacted with an object to select an input selection displayed by the display may be determined. In further embodiments, other information may be displayed on the surface of the platen, including instructions for scanning an image or the image of an object that has been scanned.

Embodiments of the invention may also include various processors, circuit boards, interconnects, power sources (e.g., batteries), and bonding materials required for fabrication of or the operation of the disclosed scanner.

The disclosed optically based planar scanner provides significant advantages over current forensic quality biometric scanning equipment. These advantages include a reduced size, a reduced weight, and a reduced cost compared to current forensic quality biometric scanning equipment. In some embodiments of the scanner 202, the thickness of the scanner (i.e., the thickness of all of the components, from the platen 204 to the display 236) is about 0.6 inches.

Further, the disclosed optically based planar scanner uses significantly less power than current forensic quality biometric scanning equipment. In some embodiments of the disclosed scanner, a laser is used for light generation. The conversion of electrical energy to light with a laser is generally very efficient. The laser light is directional, and the path that the light takes in the disclosed scanner and methods is carefully controlled. In contrast, in current forensic quality biometric scanning equipment, the light paths in the equipment are not able to be as carefully controlled due to the optics used in such equipment. Approximately one-half to one-third of the power needed to scan an image of an object in such equipment is used for the illumination system. With the disclosed scanner, less power is required, allowing, for example, the use of the scanner in mobile applications using a battery source of power. With the lower power requirements, a smaller battery can be used or more images can be generated with a given battery size.

Also, external light sources (e.g., sunlight striking the platen) do not significantly interfere with operation of the disclosed optically based planar scanner. This is due to a number of factors. First, a laser is relatively bright compared to other light sources, reducing the effects of external light sources. Second, SBGs and reflection gratings generally interact only with the specific wavelengths of light that the gratings are configured to interact with. Third, light is coupled to a waveguide at specific angles; light from external light sources would need to impinge upon the scanner at these angles for the light to be introduced to the waveguide.

Figure 4A:
FIG. 4A schematically illustrates a side view of an optically based planar scanner according to another embodiment of the present invention.

FIG. 4A schematically illustrates a side view of an optically based planar scanner according to another embodiment of the present invention. A scanner 402 includes a platen or object receiving surface 404, a top glass 407, a first plurality of SBG components 408, a middle glass 412, a second plurality of SBG components 420, a bottom glass 416, a display 436, a light source 422, and a light detector 438. The first and second pluralities of SBG components are described further, below. The display 436 of the scanner 402 may function in a similar manner as the display 236, described above. In some embodiments, the scanner 402 is also configured as an input device, as described above.

In some embodiments of the invention, the light source 422 is a laser that provides light in the visible portion of the electromagnetic spectrum or light in a portion of the electromagnetic spectrum that is not visible. If a laser is used for the light source 422, associated beam spreading optics are also included in the scanner 402. In some embodiments, the light source may be an incandescent light source or other conventional light source. Light from a wide spectrum light source may be passed though a band filter so that the wavelength(s) of light is compatible with the SBG components 408 and 420.

Figure 4B:
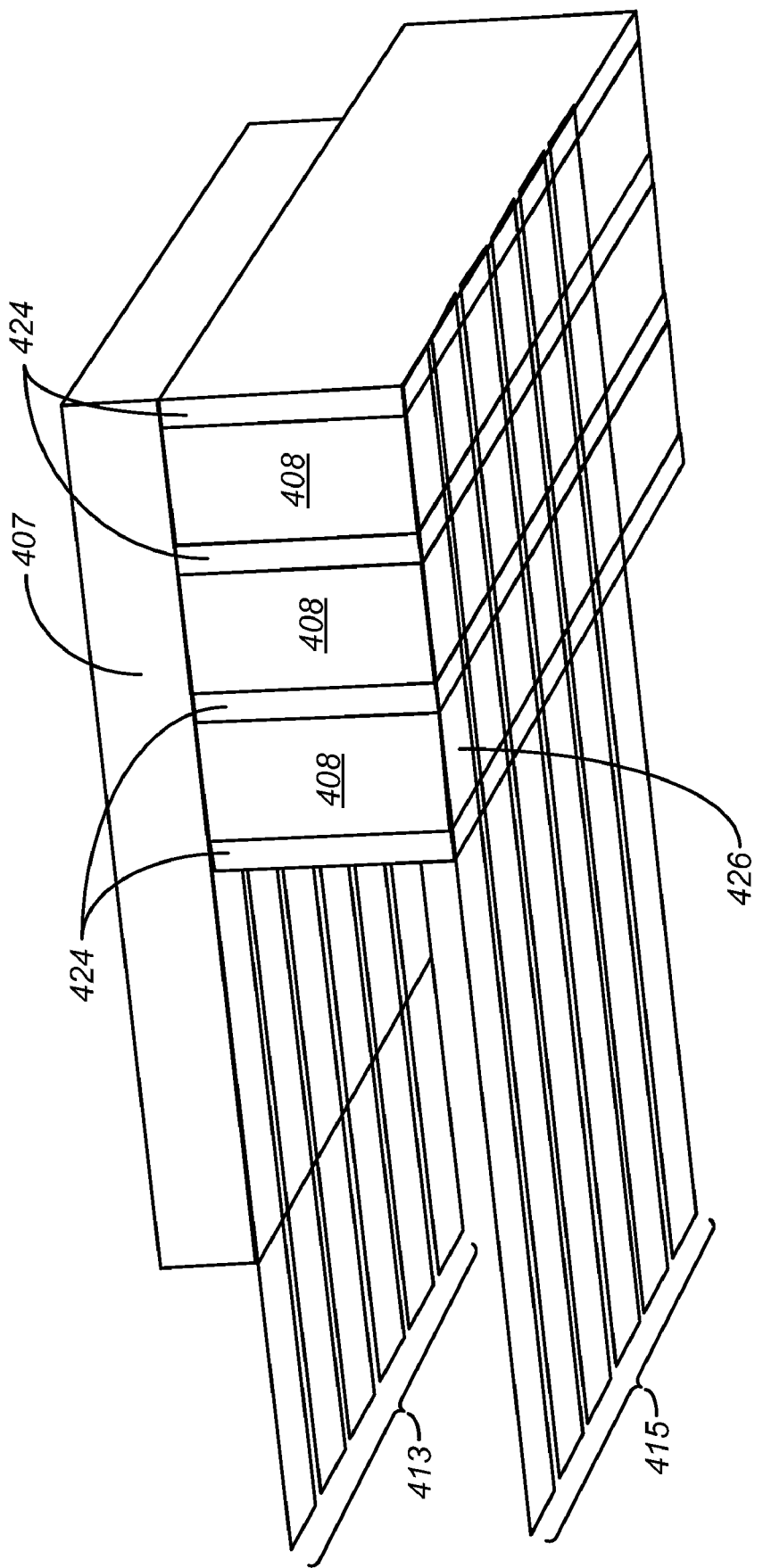
FIG. 4B schematically illustrates an enlarged view of the first plurality of switchable Bragg grating components of the planar scanner of FIG. 4A.

FIG. 4B schematically illustrates an enlarged view of the first plurality of SBG components 408 of the scanner 402 of FIG. 4A. Shown in FIG. 4B are the top glass 407, a plurality of electrodes 413 on the top surface of the first plurality of SBG components, a first plurality of SBG components 408, a plurality of electrodes 415 on the bottom surface of the first plurality of SBG components, and a plurality of waveguide walls 424. In some embodiments, the plurality of electrodes 415 on the bottom surface of the SBG components 408 is replaced with a single reference electrode (not shown), as described above. Each SBG component of the first plurality of SBG components 408 comprises a strip of SBG material. Thus, in FIG. 4A, the first plurality of SBG components 408 is a stack (extending into the page of FIG. 4A) of individual SBG components and waveguide walls 424. Not shown is the middle glass 412. The thicknesses, dimensions, and materials of the different components of scanner 402 illustrated in FIG. 4A may be the same as the different components of the scanner 202. The second plurality of SBG components 420 and waveguide walls (not shown) may have a similar configuration as the first plurality of SBG components 408 and waveguide walls 424.

On either side of each SBG component 408 is a waveguide wall of the plurality of waveguide walls 424. The waveguide walls need to be a material with a refractive index such that the light is contained within a SBG component by the waveguide walls. In some embodiments of the invention, the waveguide walls 424 have a lower index of refraction compared to the SBG components 408. In some embodiments, the waveguide walls may be an embossed polymer. The waveguide walls 424, the top glass 407, and the middle glass 412 all serve to keep the light confined to an individual SBG component of the first plurality of SBG components 408. From the perspective of FIG. 4B, light from the light source 422 travels into the plane of the page of FIG. 4B. From the perspective of FIG. 4A, the electrodes 413 and the electrodes 415 extend substantially into the plane of the page of FIG. 4A and the waveguide walls 424 are situated along the length of SBG components 408 as shown in FIG. 4A.

As noted above, in certain embodiments of the scanner 402, the light source 422 is a laser. In these embodiments, the scanner 402 may also include beam spreading and collimation optics (not shown). When the scanner 402 is configured in such a manner, the waveguide walls are not necessary in the first plurality of SBG components; i.e., the SBG of this layer would be similar to the SBG 212 of the scanner 202, described above. Due to the collimation of the light, the light will travel in an approximately straight line without spreading, removing the need for the waveguide walls. In these embodiments, however, waveguide walls are still needed for the second plurality of Bragg grating components 420 to preserve the resolution of the scanner 402.

Again, as explained in relation to FIG. 1, each electrode of the plurality of electrodes 413 corresponds to an electrode of the plurality of electrodes 415. The intersection of a pair of electrodes of the electrodes 413 and the electrodes 415 with a pair of the waveguide walls bounds an area of an SBG component, defining a cell of SBG material. The cell 426 is one such cell of SBG material. Thus, in the scanner 402, there is a plurality of cells in the first and second pluralities of SBG components. The size of the cells defined by the pairs of electrodes and the waveguide walls determines the resolution of the scanner 402.

In operation, when an AC electric field is generated between all of the pairs of electrodes of the electrodes 413 and 415, all of the areas of SBG components 408 are in a transparent state. Light from the light source 422 enters each SBG component of the first plurality of SBG components 408 at an angle such that the light will be reflected via total internal reflection between the top glass 407 and the middle glass 412 when all of the areas of the SBG components 408 are in a transparent state.

FIG. 4C schematically illustrates the path of light 444 in the scanner 402 of FIG. 4A when the scanner is in operation. Light 444 travels down the first plurality of SBG components 408 when the SBG components are in a transparent state. When a pair of electrodes does not have AC electric field generated between the pair (the electrodes 418 and 419 in FIG. 4C), the area of the SBG component associated with the electrodes is activated and in a diffraction state. When an area of an SBG component is in a diffraction state, the SBG component directs the light at region 450 at such an angle that it is taken out of total internal reflection between the top glass 407 and the middle glass 412.

When the light is taken out of total internal reflection in a SBG component, the light is directed to the object receiving surface 404. At region 452, light interacts with the object receiving surface 404 in the manner as described above (i.e., total internal reflection 445 or refraction 446 into an object contacting the object receiving surface).

The light, or portion thereof, that is reflected from the object receiving surface 404 is reflected through the first plurality of SBG components 408 to the second plurality of SBG components 420. At a SBG component of the second plurality of SBG components 420, an area of the SBG component of the second SBG components is activated and in a diffraction state. At region 454 in FIG. 4C, electrodes 428 and 429 do not have an AC electric field generated between them to activate the SBG components, and the light is directed to the detector 438.

Figure 4D:
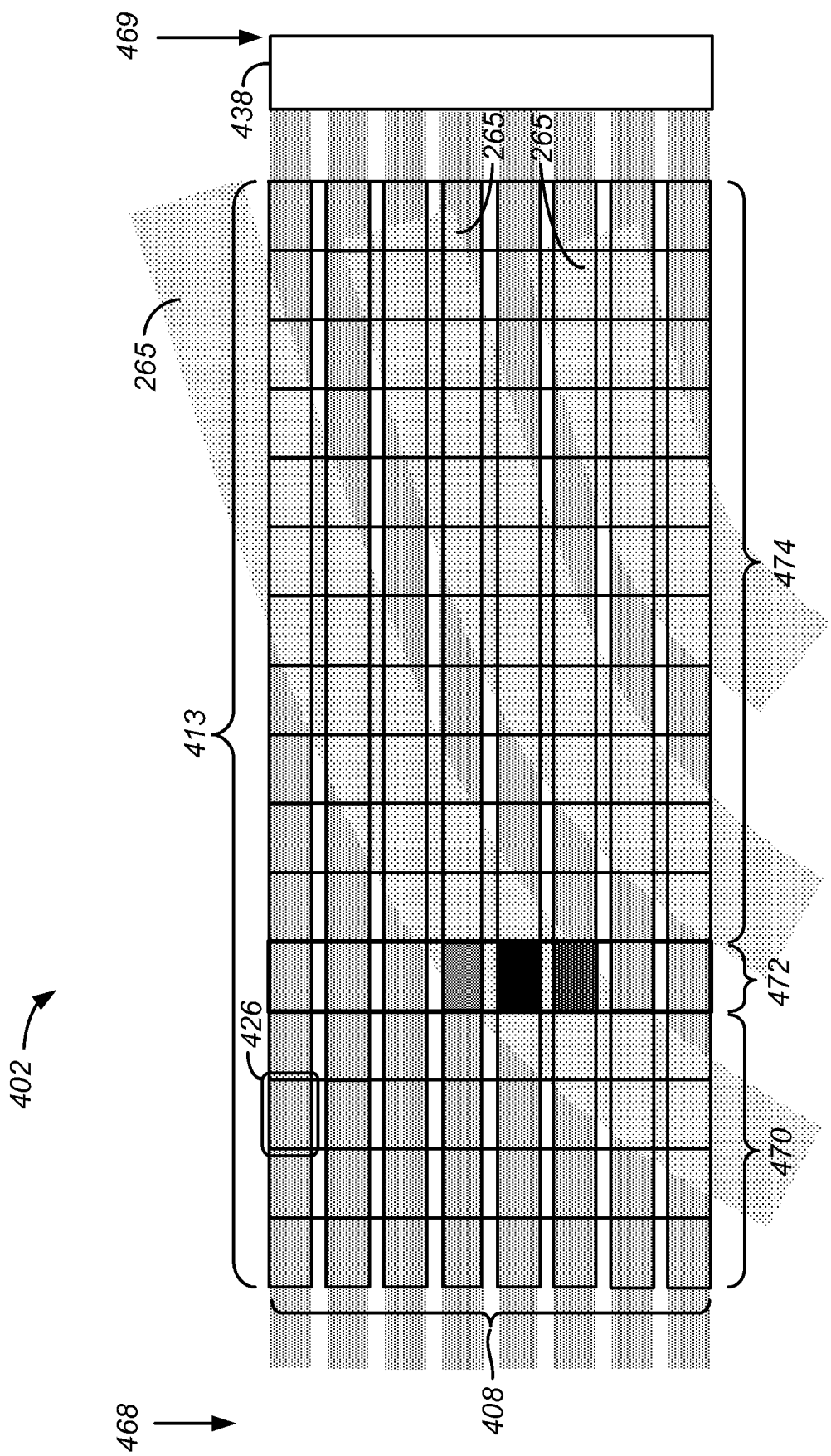
FIG. 4D schematically illustrates a top view of a portion of the planar scanner of FIG. 4A.

FIG. 4D schematically illustrates a top view of a portion of the planar scanner of FIG. 4A. FIG. 4D is similar to FIG. 2E. In FIG. 4D the light is traveling from the left hand side 468 of the figure to the right hand side 469 of the figure, similar to FIG. 4C. An object that would be in contact with the object receiving surface 404 is shown. In this instance, the object in contact with the object receiving surface 404 is a finger tip with fingerprint ridges 265. There are also three different regions shown in FIG. 4D, 470, 472, and 474. The path of the light in region 472 of FIG. 4D corresponds to regions 450, 452, and 454 of FIG. 4C.

In FIG. 4D, the pluralities of pairs of electrodes associated with the first and second pluralities of SBG components are approximately perpendicular to the direction in which the light is traveling; i.e., the pluralities of pairs of electrodes are represented by the vertical columns in FIG. 4D, but only the electrodes 413 are visible. The individual SBG components 408 of the first and second pluralities of SBG components are represented by the horizontal rows in FIG. 4D. A cell (e.g., cell 426), is defined by the intersection of a pair of electrodes and a pair of waveguide walls.

In region 470, the light is traveling though each individual SBG component of the first plurality of SBG components via total internal reflection due to no areas of the SBG components being activated. In the first plurality of SBG components 408, the light is confined to each individual SBG component by the top glass 407, the middle glass 412, and the plurality of waveguide walls 424. The light then encounters areas of the SBG components that are activated by a pair of electrodes not having an AC electric field generated between them (e.g., the electrodes 418 and 419 in FIG. 4C). As described above, when an area of the SBG is activated, the light in each individual SBG component is taken out of total internal reflection. The light is directed to the object receiving surface 404 where it interacts with the object receiving surface. This interaction is described above, with reference to FIG. 2E.

Light that is reflected from the object receiving surface 404 travels though the first plurality of SBG components 408 to activated areas of the second plurality of SBG components 420. There, the light is diffracted towards the light detector 438. In the second plurality of SBG components 420, the light is confined to each individual SBG component by the middle glass 412, the bottom glass 416, and a plurality of waveguide walls. The light detector 438 is a linear optical sensor array, in some embodiments. Each individual SBG component of the second plurality of SBG components 420 is coupled to a specific area of the light detector 438. For example, in some embodiments of the invention, each individual SBG component is coupled to a pixel of the light detector; i.e., there is one pixel location in the light detector 438 for each SBG component. By activating the areas of the SBG components of both the first and second pluralities of SBG components and measuring and storing the intensities of light associated with the activated areas, an image of the object contacting the surface of the object receiving surface may be generated, as described above.

In the scanner 402, depending on the wavelength of light used and the configuration of the scanner, areas of the first plurality of SBG components are activated and associated areas of the second plurality of SBG components are activated. In the scanner 402, these two areas are offset from each other by three electrodes, but the offset may be a smaller or greater distance, in other embodiments. For example, if the light is diffracted by the first plurality of SBG components at region 450 at a different angle than the angle in FIG. 4C, the light would reflect from the object receiving surface 404 at a different angle. Due to these different angles, light would interact with the second plurality of SBG components at an area to the left or to the right of region 454 in FIG. 4C.

Figure 5A:
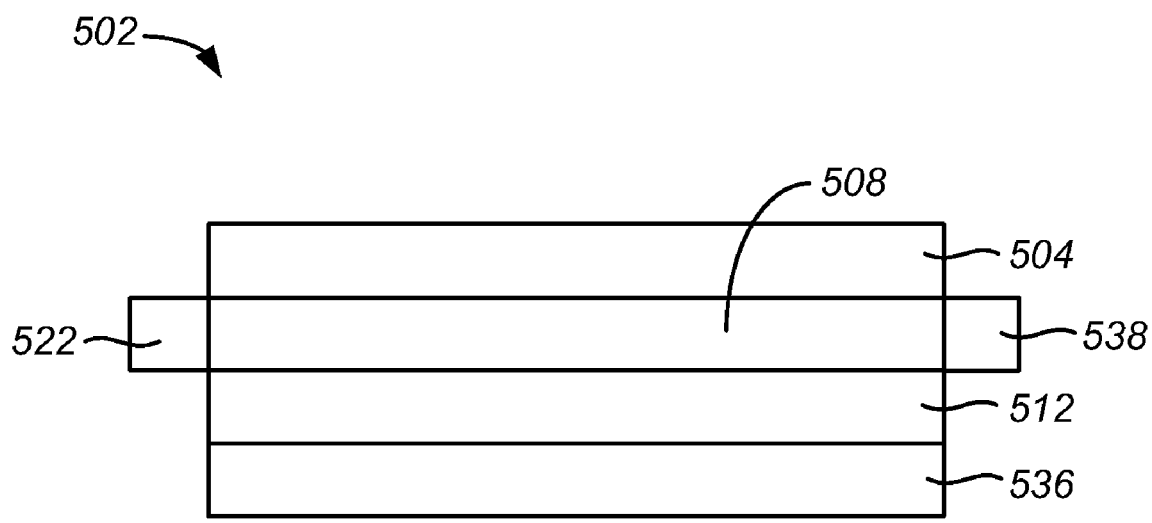
FIG. 5A schematically illustrates a side view of an optically based planar scanner according to yet another embodiment of the present invention.

FIG. 5A schematically illustrates a side view of an optically based planar scanner configured to scan images of fingerprints, palm prints, or hand prints according to yet another embodiment of the present invention. A scanner, in these embodiments, does not operate based on the total internal reflection mechanism described above (optical approach), but instead operates based on the electric field associated with the presence of a finger or palm (field approach). The scanner 502 includes a platen or object receiving surface 504, a plurality of SBG components 508, a bottom glass 512, a light source 522, a light detector 538, and a display 536. These components may be similar to the components described above with respect to the scanner 402. In some embodiments, the object receiving surface 504 is about 50 micrometers thick. The object receiving surface is also an electrical insulator. The display 536 of the scanner 502 may function in a similar manner as the display 236, described above. In some embodiments, the scanner 502 is also configured as an input device, as described above.

In embodiments of the scanner 502 in which the light source 522 is a laser, the scanner 502 may also include beam spreading and collimation optics (not shown). When the scanner 502 is configured in such a manner, the waveguide walls are not necessary in the plurality of SBG components 508; i.e., the SBG of this layer would be similar to the SBG 212 in scanner 202, described above. In embodiments of the scanner 502 in which the light source 522 is a conventional light source and the light is not collimated, waveguide walls are needed in the plurality of SBG components 508 to preserve the resolution of the scanner.

FIG. 5B schematically illustrates the path of light 544 in scanner 502 of FIG. 5A when the scanner is in operation. In FIG. 5B, there is a plurality of electrodes 510 on the bottom side of the plurality of SBG components 508, but not on the top side. In region 570, an AC electric field is generated across two adjacent electrodes due to the electrodes being driven out of phase with respect to one another. When this AC electric field interacts with the SBG components, the SBG components are in a transparent state. For example, the SBG components in the region 570 of electrodes 518 and 519 are in a transparent state due to the AC electric field (indicated by the arrow 520) generated across these two adjacent electrodes.

In operation, the electrodes in the scanner 502 are arranged such that in one region, a number of electrodes are driven in the same phase. In region 572 of FIG. 5B, three electrodes, electrodes 519, 529, and 527, are driven in the same phase. Due to these three electrodes being driven in the same phase, the electrode 529 does not generate an AC electric field in the SBG components 508 in the region 572 of the electrode 529. Due to the lack of an AC electric field, these areas of the SBG components are activated and in a diffraction state. The light is diffracted when encountering these areas of the SBG components.

If, however, a ground reference object, for example, a finger or a palm, or an object driven in the opposite phase compared to the electrode 529 is in contact with the object receiving surface 504 near the electrode 529, this object will support an AC electric field between it and the electrode 529. This AC electric field will fully or partially deactivate the SBG component; i.e., the SBG component associated with the electrode 529 will be in a completely transparent state or in a transparent/diffraction state in which a portion of the light is transmitted 560 through the SBG components (region 574) and a potion of the light is diffracted 562. The strength of the AC electric field associated with the electrode 529 is proportional to the distance between the ground reference object and the electrode 529. Thus, the amount of light diffracted when areas of the SBG components 508 are activated due to, for example, the electrode 529, is inversely proportion to the distance between the ground reference object and the electrode 529. When an area of a SBG component is activated and no ground reference object is present, no light is directed to the light detector 538; when an area of a SBG component is activated and a ground reference is present, light is directed to the light detector 538 though the SBG components in a transparent state in region 574. By activating each area of SBG components 508 and measuring and storing the intensity of light associated with each activated area, an image of the ground reference object may be generated.

In some embodiments, the resolution of an image generated with the scanner 502 is comparable to the resolution of an image produced with a scanner operating using the optical approach; i.e., the image resolution is about 500 ppi, in some embodiments. The resolution of images generated with the scanner 502 depends on the width and spacing of each electrode of the plurality of electrodes and the widths of the SBG components 508.

The scanner 502, using a field approach to generate an image of a fingerprint or a palm print, would not generate an image if some types of fake finger models were placed in contact with the object receiving surface 504. Such fake finger models may be used to try to bypass or circumvent a security system that uses fingerprints to allow/deny access, for example. An accurate three-dimensional model of a person's fingerprint might be made from a non-conductive material such as silicone, latex, or a host of other materials. Such a fake finger model might generate an accurate fingerprint image of a person's fingerprint when used with a scanner employing an optical approach, such as the scanners 202 and 402. However, with the scanner 502, such a model would not generate an accurate fingerprint image of the person's fingerprint due to the lack of conductivity of the model. Also, the scanner 502, using a field approach, is largely insensitive to moisture, which may interfere with a scanner employing an optical approach.

Figure 5C:
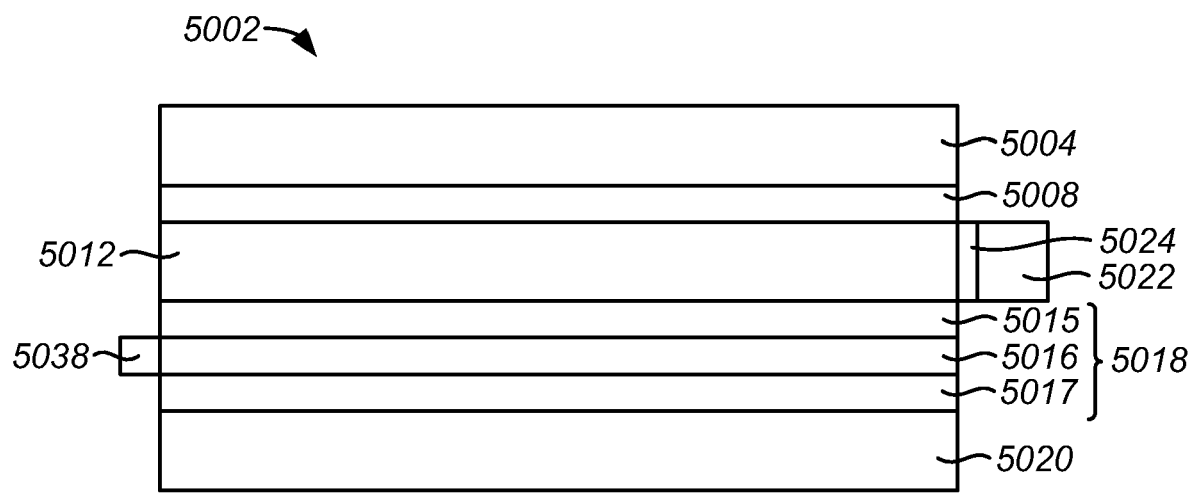
FIG. 5C schematically illustrates a side view of an optically based planar scanner according to a further embodiment of the present invention.

FIG. 5C schematically illustrates a side view of an optically based planar scanner configured to scan images of fingerprints, palm prints, or hand prints according to a further embodiment of the present invention. The scanner 5002 operates based on a field approach, similar to the scanner 502. The scanner 5002 includes a platen or object receiving surface 5004, a SBG 5008, a glass layer 5012, a waveguide 5018, a reflection grating 5020, beam spreading and collimating optics 5024, a light source 5022, and a light detector 5038. The waveguide 5018 includes a waveguide core 5016 and waveguide cladding 5015 and 5017 on either side the waveguide core 5016. These components may be similar to the components described above with respect to the scanner 202. In some embodiments, the object receiving surface 5004 is about 50 micrometers thick, and may be substantially transparent or opaque. The object receiving surface is also an electrical insulator. In embodiments of the scanner 5002 in which the light source 5022 is a laser, the scanner 5002 may also include beam spreading and collimating optics 5024. When the object receiving surface 5004 is substantially transparent, the scanner 5002 may include a display (not shown) that functions in a similar manner as the display 236, described above. In some embodiments, the scanner 5002 is also configured as an input device, as described above.

Figure 5D:
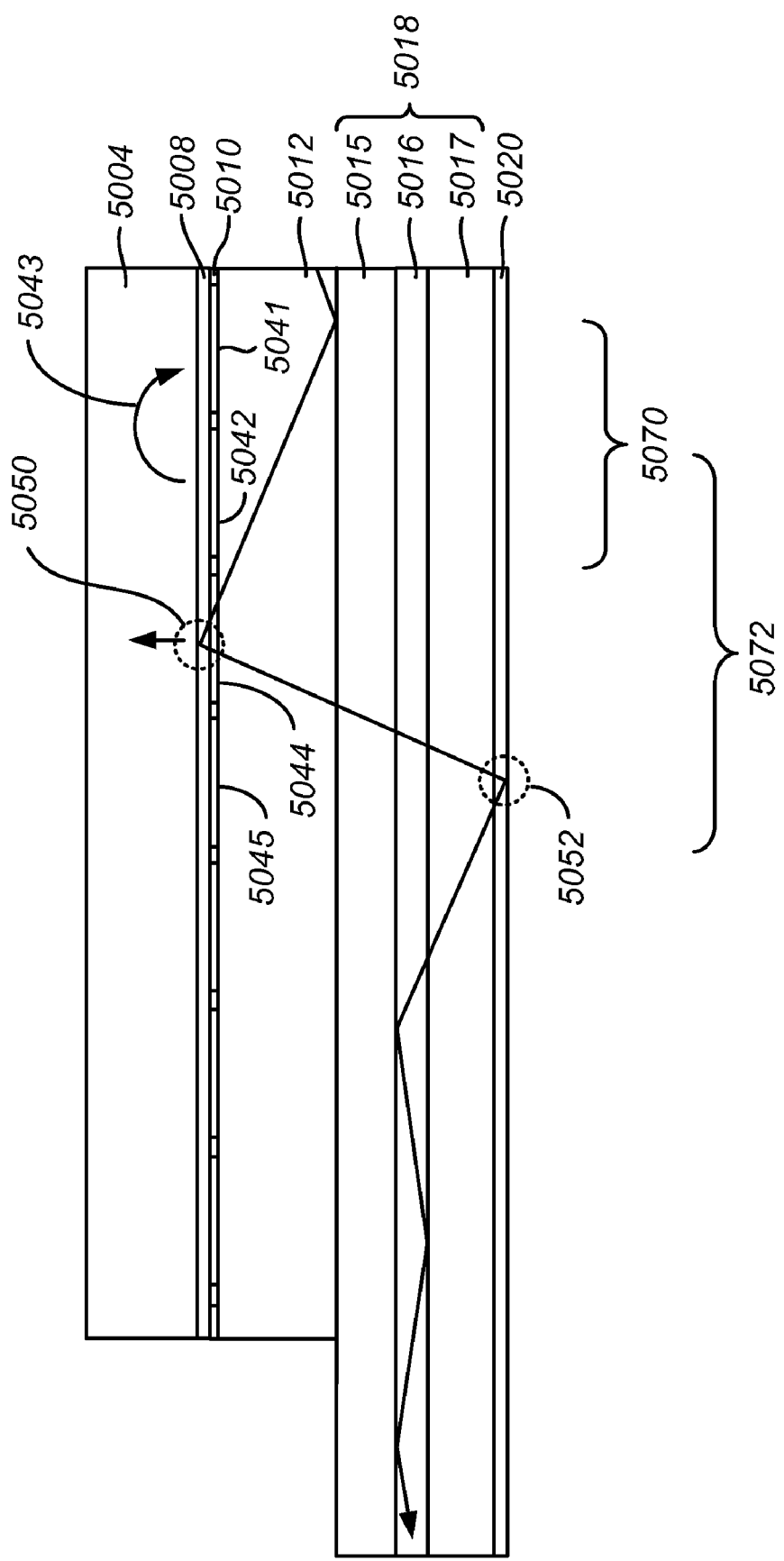
FIG. 5D schematically illustrates the light path in the planar scanner of FIG. 5C when the scanner is in operation.

FIG. 5D schematically illustrates the light path in the planar scanner of FIG. 5C when the scanner is in operation. In FIG. 5D there is a plurality of electrodes 5010 associated with the bottom side of the SBG 5008, but not with the top side. In region 5070, an AC electric field is generated across two adjacent electrodes due to the electrodes being driven out of phase with respect to one another. When this AC electric field interacts with the SBG, the SBG serves to keep all of the light in total internal reflection in the glass layer 5012. For example, the SBG in the region 5070 of the electrodes 5041 and 5042 serves to keep all of the light in total internal reflection in the glass layer due to the AC electric field (indicated by the arrow 5043) generated across these two adjacent electrodes.

In operation, the electrodes in the scanner 5002 are arranged such that in one region, a number of electrodes are driven in the same phase. In region 5072 of FIG. 5D, three electrodes, electrodes 5042, 5044, and 5045, are driven in the same phase. Due to these three electrodes being driven in the same phase, the electrode 5044 does not generate an AC electric field in the SBG 5008 in the region 5072 of the electrode 5044. Due to the lack of an AC electric field, this area of the SBG is activated. When an area of SBG 5008 is activated, light traveling though the glass layer 5012 is taken out of total internal reflection with the SBG 5008 in the region of the activated area of the SBG.

When light is taken out of total internal reflection with the SBG 5008 at area 5050, the light is reflected via total internal reflection from the bottom surface of the object receiving surface 5004 through the SBG 5008, the glass layer 5012, and the waveguide 5018 to the reflection grating 5020. At the reflection grating 5020 at area 5052, the light is reflected into the waveguide 5018. The waveguide 5018 guides the light from the reflection grating 5020 to the light detector 5038 via total internal reflection.

If, however, a ground reference object (e.g., a finger or a palm) is contacting the object receiving surface 5004 near the electrode 5044, the ground reference object will support an AC electric field between it and the electrode 5044. This AC electric field will fully or partially deactivate the SBG; i.e., all of the light traveling though the glass layer 5012 will remain in total internal reflection with the SBG 5008 or a portion of the light will be in total internal reflection with the SBG 5008 and a portion of the light will be reflected via total internal reflection by the bottom surface of the object receiving surface 5004. The strength of the AC electric field associated with the electrode 5044 is proportional to the distance between the ground reference object and the electrode 5044. Thus, the amount of light reflected when areas of the SBG 5008 are activated due to, for example, the electrode 5044, is inversely proportion to the distance between the ground reference object and the electrode 5044. When an area of the SBG 5008 is activated and no ground reference object is present, no light is directed to the light detector 5038; when an area of the SBG 5008 is activated and a ground reference is present, light is directed to the light detector 5038 though the waveguide 5018. By activating each area of the SBG 5008 and measuring and storing the intensity of light associated with each activated area, an image of the ground reference object may be generated.

Figure 6:
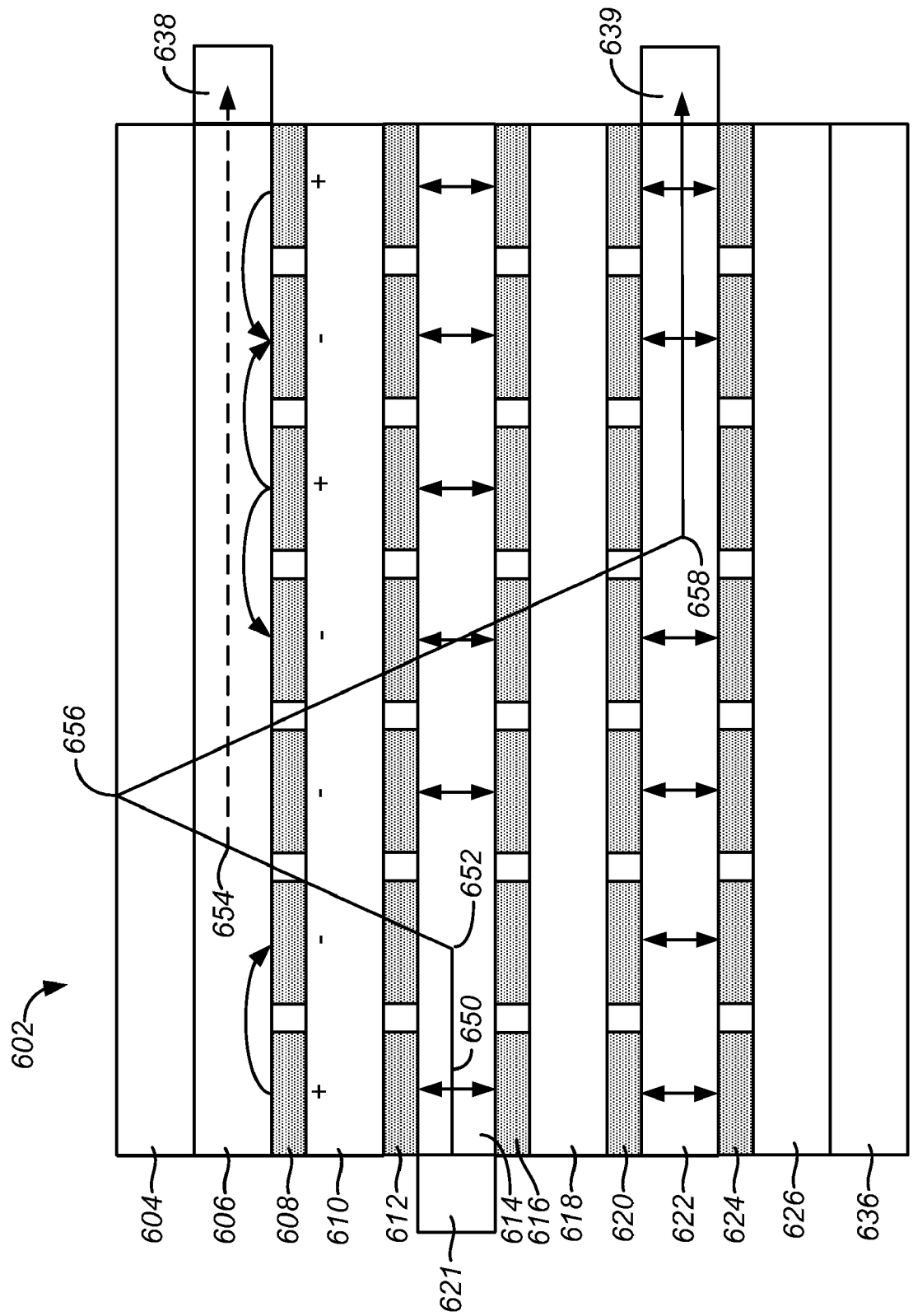
FIG. 6 schematically illustrates a side view of an optically based planar scanner and the light path in the planar scanner according to a further embodiment of the present invention.

FIG. 6 schematically illustrates a side view of an optically based planar scanner according to a further embodiment of the present invention. A scanner 602 includes components of the scanner 402 and the scanner 502. The scanner 602 includes a platen or object receiving surface 604, a first plurality of SBG components 606, a plurality of electrodes 608 associated with the first SBG components, and a first glass 610. This portion of the scanner 602 is similar to the scanner 502; the SBG components and electrodes in this portion of the scanner may be configured in a similar manner as the configurations described above in reference to the scanner 502. Further associated with this portion of the scanner 602 is a light detector 638. The scanner 602 further includes a second plurality of SBG components 614 with a plurality of electrodes 612 on a top surface of the second SBG components and a plurality of electrodes 616 on a bottom surface of the second SBG components, a second glass 618, a third plurality of SBG components 622 with a plurality of electrodes 620 on a top surface of the third SBG components and a plurality of electrodes 624 on a bottom surface of the third SBG components, and a third glass 626. This portion of the scanner 602 is similar to the scanner 402; the SBG components and electrodes in this portion of the scanner may be configured in a similar manner as the configurations described above in reference to scanner 402. Further associated with this portion of the scanner 602 are a light source 621 and a light detector 639. A display 636 of the scanner 602 may function in a similar manner as the display 236, described above.

In operation, light 650 from the light source 672 travels down the second plurality of SBG components 614 via total internal reflection when the SBG components are in a transparent state. At region 652, light 650 interacts with areas of SBG components that are activated and in a diffraction state. Here, light 650 is taken out of total internal reflection and directed to an activated area of the first plurality of SBG components 606. At region 654, in an activated area of first SBG components, a portion of the light is diffracted towards the light detector 638 if no ground reference object (e.g., a finger) is present. The first plurality of SBG components are configured such that only a known percentage of the light is diffracted towards the light detector 638 if no ground reference object is present. In some embodiments, 50% of the light is diffracted towards the light detector 638 if no ground reference object is present. If a ground reference object is present and the SBG components at region 654 are not activated, the light travels to the object receiving surface 604.

At the object receiving surface 604, the light interacts with the surface at region 656, as described above; i.e., light is refracted into an object in contact with the object receiving surface, if such an object is present. Light that is reflected via total internal reflection from the object receiving surface 604 travels though the first plurality of SBG components 606 and the second plurality of SBG components 614 to activated areas of the third plurality of SBG components 622. At region 658, the light is diffracted towards the light detector 639.

In some embodiment, in the first and third pluralities of SBG components, the light is confined to individual SBG components with waveguide walls. In some embodiments, the light detectors 638 and 639 are linear optical sensor arrays. Each individual SBG component of the first and third pluralities of SBG components is coupled to a specific area of the respective light detector 638 or 639. By activating the areas of the SBG components of the first, second, and third pluralities of SBG components, measuring the intensities of light associated with the activated areas, and storing the measured intensities, images of the object contacting the surface of object receiving surface may be generated, as described above. The light detector 638 generates an image based on the field approach, and the light detector 639 generates an image based on the optical approach.

In some embodiments, the scanner 602 is also configured as an input device, as described above. Either light detector (i.e., the light detector 638 or the light detector 639) may be used to determine an area of the object receiving surface 604 being contacted with an object.

An advantage of the scanner 602, which implements two different measurement methods working together, is that it combines the strengths of each measurement method. For example, the field approach would not generate a fingerprint from a non-conductive fake finger model, whereas such model may generate an accurate fingerprint using an optical approach. As another example, a simple conductive fake finger model may generate an accurate print using the field approach, whereas such a finger model may not have the optical fidelity to generate an accurate fingerprint with the optical method. Creating finger models that are able to generate accurate fingerprints with both the field approach and the optical approach would be difficult.

The scanner 602 is useful for many applications. For example, the scanner 602 could be used in a system where public access is unsupervised and methods of determining if a finger or palm applied to the object receiving surface 604 is real or fake are needed.

The apparatus and methods described above implement approaches that attenuate or enhance the flow of light. The apparatus and methods may be reconfigured such that a specific apparatus or method may implement either approach.

A number of embodiments of the invention have been described. Nevertheless, it will be understood that various modifications may be made without departing from the spirit and scope of the invention.

What is claimed is:

1. An apparatus configured to scan an image, comprising:
    a light source configured to provide light;
    a light detector configured to detect the light;
    a platen;
    a waveguide;
    a reflection grating;
    a switchable Bragg grating; and
    wherein an area of the switchable Bragg grating is configured to be activated to direct the light through the reflection grating and the waveguide to the platen, wherein the platen is configured to reflect the light via total internal reflection though the waveguide to the reflection grating or to refract the light, wherein the reflection grating is configured to reflect the light reflected from the platen to the waveguide, and wherein the waveguide is configured to guide the light to the light detector.

2. The apparatus of claim 1, wherein the apparatus is configured to scan a fingerprint image, a palm print image, or a hand print image.

3. The apparatus of claim 1, the light source comprising a laser.

4. The apparatus of claim 3, the laser comprising a laser configured to output infrared light.

5. The apparatus of claim 1, further comprising:
    a plurality of transparent conducting oxide electrodes on a first surface and on a second surface of the switchable Bragg grating, each electrode on the first surface corresponding to an electrode on the second surface to form a plurality of pairs of electrodes.

6. The apparatus of claim 5, the transparent conducting oxide of the electrodes comprising indium tin oxide.

7. The apparatus of claim 5, wherein a pair of the pairs of electrodes is configured to generate an AC electric field.

8. The apparatus of claim 7, wherein the area of the switchable Bragg grating between the pair of electrodes is activated when an AC electric field is not generated between the pair of electrodes.

9. The apparatus of claim 1, further comprising:
    a plurality of transparent conducting oxide electrodes on a first surface of the switchable Bragg grating; and
    a layer of transparent conducting oxide electrode on a second surface of the switchable Bragg grating.

10. The apparatus of claim 1, further comprising:
    a polarizer, the polarizer configured to polarize the light from the light source before the light enters the switchable Bragg grating.

11. The apparatus of claim 1, further comprising:
    a first glass layer on a first side of the switchable Bragg grating; and
    a second glass layer on a second side of the switchable Bragg grating.

12. The apparatus of claim 1, the light detector selected from the group consisting of a plurality of optical sensor arrays, a two-dimensional optical sensor array, and a linear optical sensor array.

13. The apparatus of claim 1, wherein the platen, the waveguide, the reflection grating, and the switchable Bragg grating are transparent, the apparatus further comprising:
    a display, the display configured to be visible from a surface of the platen.

14. The apparatus of claim 13, wherein the display is further configured to display the image and an input selection.

15. An apparatus configured to scan an image and to receive input, comprising:
    a light source configured to provide light;
    a light detector configured to detect the light;
    a platen;
    a waveguide, the waveguide located under the platen;
    a reflection grating, the reflection grating located under the waveguide;
    a switchable Bragg grating, the switchable Bragg grating located under the reflection grating, wherein the platen, the waveguide, the reflection grating, and the switchable Bragg grating are transparent;
    a display, the display configured to be visible to a user of the apparatus and to display an input selection, the display located under the switchable Bragg grating; and
    wherein an area of the switchable Bragg grating is configured to be activated to direct the light through the reflection grating and the waveguide to the platen, wherein the platen is configured to reflect the light via total internal reflection though the waveguide to the reflection grating or to refract the light, wherein the reflection grating is configured to reflect the light reflected from the platen to the waveguide, and wherein the waveguide is configured to guide the light to the light detector.

16. A method of scanning an image, the method comprising:
    (a) providing light to a switchable Bragg grating;
    (b) activating an area of the switchable Bragg grating to direct the light through a reflection grating and a waveguide to a platen;
    (c) reflecting the light from a surface of the platen via total internal reflection or refracting the light into an object contacting the surface of the platen, the reflected light directed through the waveguide to the reflection grating;
    (d) reflecting the reflected light from the reflection grating to the waveguide; and
    (e) guiding the reflected light with the waveguide to a detector.

17. The method of claim 16, further comprising:
    transmitting the light through a polarizer before providing the light to the switchable Bragg grating.

18. The method of claim 16, wherein the light is provided by a laser, further comprising:
    collimating and expanding the light from the laser before providing the light to the switchable Bragg grating.

19. The method of claim 16, wherein the switchable Bragg grating includes a plurality of areas configured to be activated, further comprising:
repeating steps (b)-(e) for each area of the switchable Bragg grating configured to be activated.

20. The method of claim 19, further comprising:
measuring an intensity of the light with the detector after each repetition of steps (b)-(e).

21. The method of claim 20, further comprising:
storing the measured intensity of the light after each repetition of steps (b)-(e); and
generating an image of the object contacting the platen using the measured intensities of the light.

22. The method of claim 16, further comprising:
displaying an input selection with a display, the display located under the platen, the waveguide, the reflection grating, and the switchable Bragg grating, the input selection being visible from the surface of the platen; and
detecting a selection of the input selection.

23. The method of claim 22, wherein the switchable Bragg grating includes a plurality of areas configured to be activated, wherein detecting a selection of the input selection includes:
repeating steps (b)-(e) for each area of the switchable Bragg grating configured to be activated;
measuring an intensity of the light with the detector after each repetition of steps (b)-(e); and
determining a region of the platen being contacted with a second object to select the input selection.

24. An apparatus configured to scan an image, comprising:
a light source configured to provide light;
a light detector configured to detect the light;
an object receiving surface;
a first plurality of switchable Bragg grating components arranged to form a first layer;
a second plurality of switchable Bragg grating components arranged to form a second layer; and
wherein areas of the first plurality of switchable Bragg grating components are configured to be activated to direct the light to the object receiving surface, wherein the object receiving surface is configured to reflect the light via total internal reflection though the first switchable Bragg grating components to activated areas of the second plurality of switchable Bragg grating components or to refract the light, and wherein the activated areas of the second switchable Bragg grating components are configured to direct the light towards the light detector.

25. The apparatus of claim 24, wherein each switchable Bragg grating component of the first plurality of switchable Bragg grating components and the second plurality of switchable Bragg grating components includes a waveguide wall on either side of a switchable Bragg grating material, the waveguide walls configured contain the light within the switchable Bragg grating material.

26. The apparatus of claim 24, further comprising:
a first plurality of transparent conducting oxide electrodes on a first surface and on a second surface of the first plurality of switchable Bragg grating components, each electrode on the first surface corresponding to an electrode on the second surface to form a first plurality of pairs of electrodes; and
a second plurality of transparent conducting oxide electrodes on a first surface and on a second surface of the second plurality of switchable Bragg grating components, each electrode on the first surface corresponding to an electrode on the second surface to form a second plurality of pairs of electrodes.

27. The apparatus of claim 24, wherein a pair of the first plurality of pairs of electrodes is configured to generate an AC electric field, and wherein a pair of the second plurality of pairs of electrodes is configured to generate an AC electric field.

28. The apparatus of claim 27, wherein the areas of the first plurality of switchable Bragg grating components between the pair of electrodes of the first plurality of pairs of electrodes is activated when an AC electric field is not generated between the pair of electrodes, and wherein the areas of the second plurality of switchable Bragg grating components between the pair of electrodes of the second plurality of pairs of electrodes is activated when an AC electric field is not generated between the pair of electrodes.

29. The apparatus of claim 24, wherein the object receiving surface, the first plurality of switchable Bragg grating components, and the second plurality of switchable Bragg grating components are transparent, the apparatus further comprising:
a display, the display configured to be visible from the object receiving surface, the display located under the object receiving surface, the first plurality of Bragg grating components, and the second plurality of Bragg grating components.

30. An apparatus configured to scan an image, comprising:
a light source configured to provide light;
a light detector configured to detect the light;
a platen;
a switchable Bragg grating;
a glass layer;
a waveguide;
a reflection grating; and
wherein an area of the switchable Bragg grating is configured to be activated such that light is taken out of total internal reflection with the switchable Bragg grating, wherein the platen is configured to reflect the light taken out of total internal refection with the switchable Bragg grating via total internal refection though the waveguide to the reflection grating, wherein the reflection grating is configured to reflect the light reflected from the platen to the waveguide, and wherein the waveguide is configured to guide the light to the light detector.

31. The apparatus of claim 30, further comprising:
a plurality of electrodes associated with the switchable Bragg grating, wherein the area of the switchable Bragg grating is activated when an electrode of the plurality of electrodes does not generate an AC electric field in the area of the switchable Bragg grating.

32. The apparatus of claim 31, wherein adjacent electrodes of the plurality of electrodes are configured to generate an AC electric field in areas of the switchable Bragg grating.

33. The apparatus of claim 30, the light source comprising a laser.

34. The apparatus of claim 30, the light detector selected from the group consisting of a plurality of optical sensor arrays, a two-dimensional optical sensor array, and a linear optical sensor array.

35. The apparatus of claim 30, wherein light is not taken out of total internal reflection with the switchable Bragg grating when the area of the switchable Bragg grating is activated and a ground reference object is in contact with the platen.

* * * * *